(12) United States Patent
Kinemura

(10) Patent No.: US 12,736,596 B2
(45) Date of Patent: Sep. 15, 2026

(54) ELECTRONIC DEVICE

(71) Applicant: Alps Alpine Co., Ltd., Tokyo (JP)

(72) Inventor: Kazuhiko Kinemura, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 180 days.

(21) Appl. No.: 18/679,725

(22) Filed: May 31, 2024

(65) Prior Publication Data

US 2024/0319290 A1 Sep. 26, 2024

Related U.S. Application Data

(63) Continuation of application No. PCT/JP2022/047577, filed on Dec. 23, 2022.

(30) Foreign Application Priority Data

Jan. 13, 2022 (JP) ................................ 2022-003500

(51) Int. Cl.

*G01R 31/52* (2020.01)
*H03K 17/082* (2006.01)
*G01R 31/34* (2020.01)

(52) U.S. Cl.

CPC ......... *G01R 31/52* (2020.01); *H03K 17/0822* (2013.01); *G01R 31/343* (2013.01)

(58) Field of Classification Search

CPC .................................................. G01R 31/002
See application file for complete search history.

(56) References Cited

U.S. PATENT DOCUMENTS 7,724,046 B2 * 5/2010 Wendt ................ H03K 17/6872 327/110
2018/0149694 A1 * 5/2018 Miyazaki ................ H02H 7/00

FOREIGN PATENT DOCUMENTS

JP H10-142284 A 5/1998
JP 2014-224795 A 12/2014
JP 2015-233189 A 12/2015
JP 2021-063657 A 4/2021

* cited by examiner

*Primary Examiner* — Tung X Nguyen
(74) *Attorney, Agent, or Firm* — Harness, Dickey & Pierce, 1P.L.C.

(57) ABSTRACT

An electronic device includes: a plurality of loads, a switching element provided in a current path connected to the plurality of loads, a failure diagnosis unit that performs failure diagnosis according to voltages applied to the plurality of loads, and a driving circuit that drives the switching element. The driving circuit outputs, to the switching element, a driving control signal that represents a result of comparison between a load signal resulting from converting a current flowing in the current path to a voltage and a reference signal used as a reference for the operation of the switching element. If the failure diagnosis unit detects a voltage outside a normal voltage range, the failure diagnosis unit decides that the load is in an abnormal state.

11 Claims, 16 Drawing Sheets

100
Power
101
110A
110B
120
D
G
S
R1
R2
R3
R4
R5
R6
R7
130
REFERENCE SIGNAL
140
ADC
150
MICROCONTROLLER
151
REFERENCE SIGNAL CREATION UNIT
152
FAILURE DIAGNOSIS UNIT
153
MEMORY
REFERENCE SIGNAL
130

START

S1: ACQUIRE OUTPUT VOLTAGE OF ADC

S2: COMPARE OUTPUT VOLTAGE FROM ADC WITH VOLTAGE DATA

S3: PERFORM FAILURE DIAGNOSIS

END

200
Power
101
110A
R11
135A
T81
R10
140
R8
R12
T82
R13
110B
R15
135B
T91
R14
R9
R16
T92
R17
140
ADC
135A
150
MICROCONTROLLER
151
REFERENCE SIGNAL CREATION UNIT
152
FAILURE DIAGNOSIS UNIT
153
MEMORY
REFERENCE SIGNAL
130
D
120
G
S
130
REFERENCE SIGNAL
R2
R3
R1
R4
R5

ELECTRONIC DEVICE

CLAIM OF PRIORITY

This application is a Continuation of International Application No. PCT/JP2022/047577 filed on Dec. 23, 2022, which claims benefit of Japanese Patent Application No. 2022-003500 filed on Jan. 13, 2022. The entire contents of each application noted above are hereby incorporated by reference.

BACKGROUND OF THE INVENTION

1. Field of the Invention

The present disclosure relates to an electronic device.

2. Description of the Related Art

A conventional short-circuit detection device that detects a short-circuit in an inductive load has a load driving circuit formed by connecting an inductive load and a field-effect transistor to a direct-current power supply as well as a detection circuit that includes a comparator connected between the inductive load and the field-effect transistor. At the time of driving the field-effect transistor in the load driving circuit, the short-circuit detection device uses the comparator to compare an input voltage to the detection circuit with a reference voltage, and detects whether there is a short-circuit in the inductive load. When the inductive load is not short-circuited to the gate of the field-effect transistor during the diagnosis of the load driving circuit, a diagnostic driving signal is given that is short to the extent that even when the field-effect transistor is turned on, almost no current flows into the inductive load (see Japanese Unexamined Patent Application Publication No. 10-142284, for example).

In the conventional short-circuit detection device intended for an inductive load, the field-effect transistor is driven with a driving voltage in an extremely short pulse shape. Therefore, a short-circuit in the inductive load may be mistakenly detected. If the inductive load is short-circuited, an excessive current may flow into the field-effect transistor and the field-effect transistor (switching element) may be thereby damaged.

SUMMARY OF THE INVENTION

In view of this, the present disclosure provides an electronic device that can reliably perform failure diagnosis for a load while suppressing damage to a switching element.

An electronic device in an embodiment of the present disclosure includes a plurality of loads, a switching element provided in a current path connected to the plurality of loads, a failure diagnosis unit that performs failure diagnosis according to voltages applied to the plurality of loads, and a driving circuit that drives the switching element. The driving circuit outputs, to the switching element, a driving control signal that represents a result of comparison between a load signal resulting from converting a current flowing in the current path to a voltage and a reference signal used as a reference for the operation of the switching element. If the failure diagnosis unit detects a voltage outside a normal voltage range, the failure diagnosis unit decides that the load is in an abnormal state.

It is possible to provide an electronic device that can reliably perform failure diagnosis for a load while suppressing damage to a switching element.

DESCRIPTION OF THE PREFERRED EMBODIMENTS

Embodiments to which the electronic device in the present disclosure is applied will be described below.

Embodiment 1

Structure of an Electronic Device 100

Figure 1:
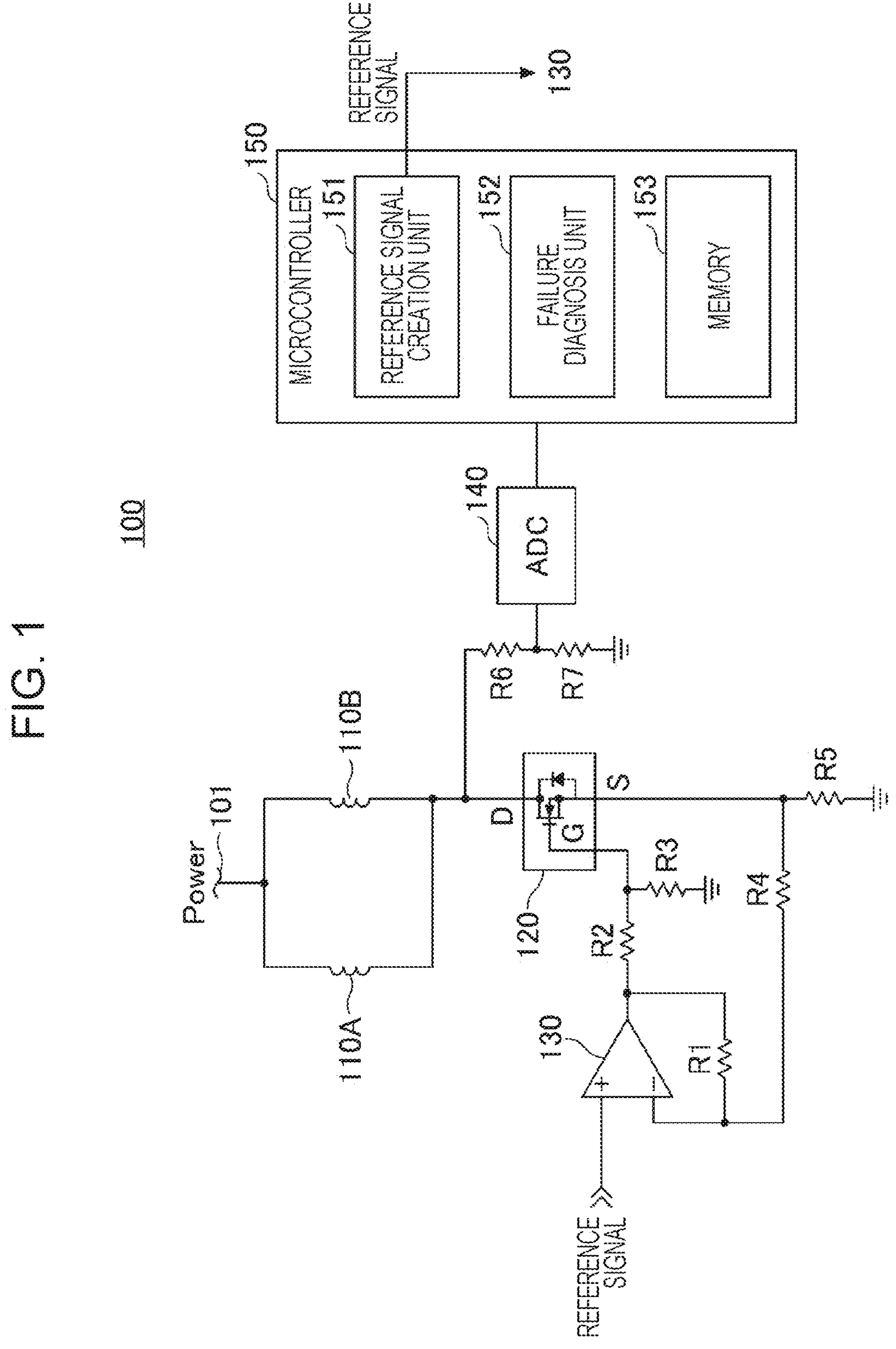
FIG. 1 illustrates an electronic device in embodiment 1.

FIG. 1 illustrates the electronic device 100 in embodiment 1. The electronic device 100 includes a power supply terminal 101, actuators 110A and 110B, a field-effect transistor (FET) 120, an ope-amplifier 130, an analog-to-digital converter (ADC) 140, a microcontroller 150, and resistors R1 to R7. A voltage applied to the power supply terminal 101 is higher than rated voltages on which the ope-amplifier 130, ADC 140, and microcontroller 150 operate. The actuators 110A and 110B are an example of a plurality of loads. The FET 120 is an example of a switching element. The ope-amplifier 130 is an example of a driving circuit.

The actuators 110A and 110B are vibration elements such as piezoelectric elements. The vibration element may be an eccentric motor, a solenoid, a linear resonant actuator (LRA), or the like. The actuators 110A and 110B have the same resistance value and are identical products, as an example. The electronic device 100 is a device that drives the actuators 110A and 110B to cause them to generate vibration, as an example. The actuators 110A and 110B are attached to a manipulation portion of an input device or the like in which the electronic device 100 is incorporated. When the actuators 110A and 110B are driven and vibrate while a hand or the like is in contact with the manipulation portion, the actuators 110A and 110B give tactile sense to the user through the hand or the like. Thus, the electronic device 100 can also be considered as a tactile giving device.

The plurality of loads included in the electronic device 100 are not limited to vibration elements. They may be, for example, light emitting diodes (LEDs), motors, heaters, or the like. The electronic device 100 drives a plurality of loads and also performs failure diagnosis for the loads. Failure diagnosis is performed by the microcontroller 150.

The actuators 110A and 110B are inserted into two wires in series, one into each wire, the two wires being connected to the power supply terminal 101 from which direct-current power is output. The two wires connected to the power supply terminal 101 are connected to the drain terminal (D) of the FET 120.

The FET 120 has the drain terminal (D), a source terminal (S), and a gate terminal (G). The drain terminal is connected to the actuators 110A and 110B. The source terminal is connected to the inverting input terminal of the ope-amplifier 130 through the resistor R4 and is grounded through the resistor R5. A path routed from the power supply terminal 101 through the actuators 110A and 110B, FET 120, and resistor R5 to an earth potential point is a current path through which currents are supplied to the actuators 110A and 110B. The FET 120 forms a constant-current circuit together with the ope-amplifier 130.

The ope-amplifier 130 has a non-inverting input terminal into which a reference signal is entered from the microcontroller 150, the inverting input terminal connected to the source terminal of the FET 120 through the resistor R4, and an output terminal connected to the gate terminal of the FET 120 through the resistor R2. The resistor R1 is connected between the inverting input terminal and output terminal of the ope-amplifier 130 as a negative feed-back resistor. The resistor R3 is connected so as to branch from between the resistor R2 and the gate terminal of the FET 120. Another end of the resistor R3 is grounded. The resistor R3 has a function that determines a voltage to be applied to the gate terminal of the FET 120 so as to prevent the FET 120 from being unintentionally turned on by noise or the like.

A load signal resulting from converting a current flowing in a current path between the actuators 110A and 110B and the resistor R5 to a voltage is entered into the inverting input terminal. The reference signal entered into the non-inverting input terminal is used as a reference for the operation of the FET 120. The ope-amplifier 130 outputs, to the gate terminal of the FET 120, a driving control signal representing a result of comparison between the reference signal and the load signal entered into the inverting input termina.

The ADC 140 is connected to a wire (current path) between the actuators 110A and 110B and the drain terminal of the FET 120 through a voltage dividing circuit including the resistors R6 and R7. The ADC 140 converts a voltage value to a digital value and outputs the digital value to the microcontroller 150. The resistors R6 and R7 are set so that when the voltage at the power supply terminal 101 is applied to the ADC 140, the voltage is lowered below the rated voltage of the ADC 140.

The microcontroller 150 has a reference signal creation unit 151, a failure diagnosis unit 152, and a memory 153. The microcontroller 150 is implemented by a computer that includes a central processing unit (CPU), a random-access memory (RAM), a read-only memory (ROM), a hard disk drive) (HDD), an input/output interface, an internal bus, and the like. The reference signal creation unit 151 and failure diagnosis unit 152 are functional block representations of functions of programs executed by the microcontroller 150. The memory 153 is a functional representation of a memory in the microcontroller 150.

The reference signal creation unit 151 creates a reference signal and outputs it to the non-inverting input terminal of the ope-amplifier 130. While the actuators 110A and actuator 110B are in the normal state, upon the receipt of a driving command from an input device or the like that incorporates the electronic device 100, the reference signal creation unit 151 creates a reference signal used to drive the actuators 110A and 110B in response to the driving command. When the failure diagnosis unit 152 performs failure diagnosis, the reference signal creation unit 151 also creates a reference signal for failure diagnosis and outputs it so that, predetermined voltages lower than operating voltages on which the actuators 110A and 110B operate are applied to the actuators 110A and 110B. Details of this will be described later.

The failure diagnosis unit 152 performs failure diagnosis for the actuators 110A and 110B according to the voltage entered from the ADC 140. The voltage entered from the ADC 140 represents the voltage applied to the actuators 110A and 110B, which are two loads. In failure diagnosis, it is decided whether there is an open failure (wire breakage), a short failure (short-circuit), or another abnormality in the actuator 110A or 110B. If there is not any of an open failure, a short failure, and another abnormality, the actuators 110A and 110B are in the normal state.

The memory 153 stores programs and data that are needed for the reference signal creation unit 151 to perform creation processing for the reference signal as well as program and data needed for the failure diagnosis unit 152 to perform failure diagnosis.

Flow of Currents in the Normal State

Figure 2A:
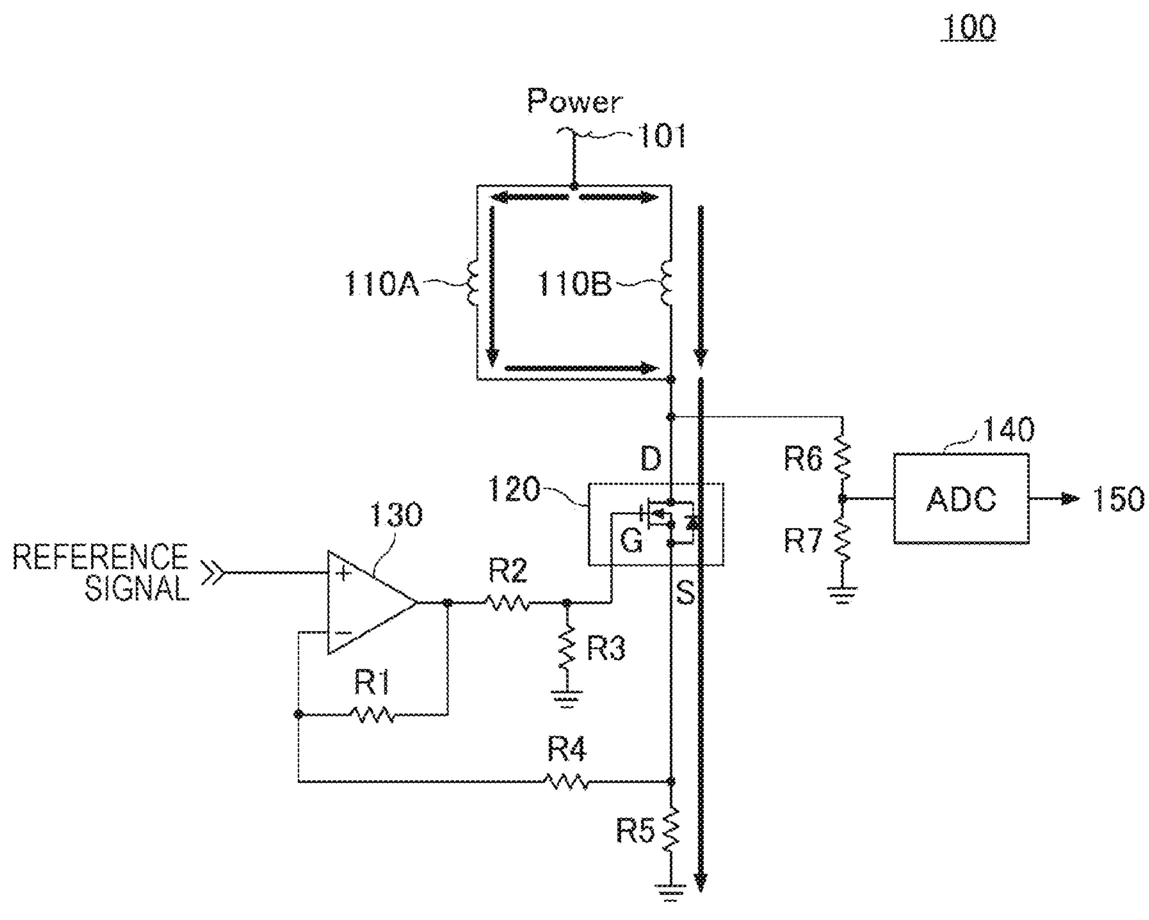
FIG. 2A illustrates the flow of currents in a normal state.

FIG. 2A illustrates flows of currents in the normal state. While the actuators 110A and 110B are in the normal state, currents flow from the power supply terminal 101, pass through the actuators 110A and 110B and FET 120, and flow toward the resistor R5, as illustrated by the arrows in FIG. 2A.

Flow of Currents while the Actuator 110B is in the Open Failure State

Figure 2B:
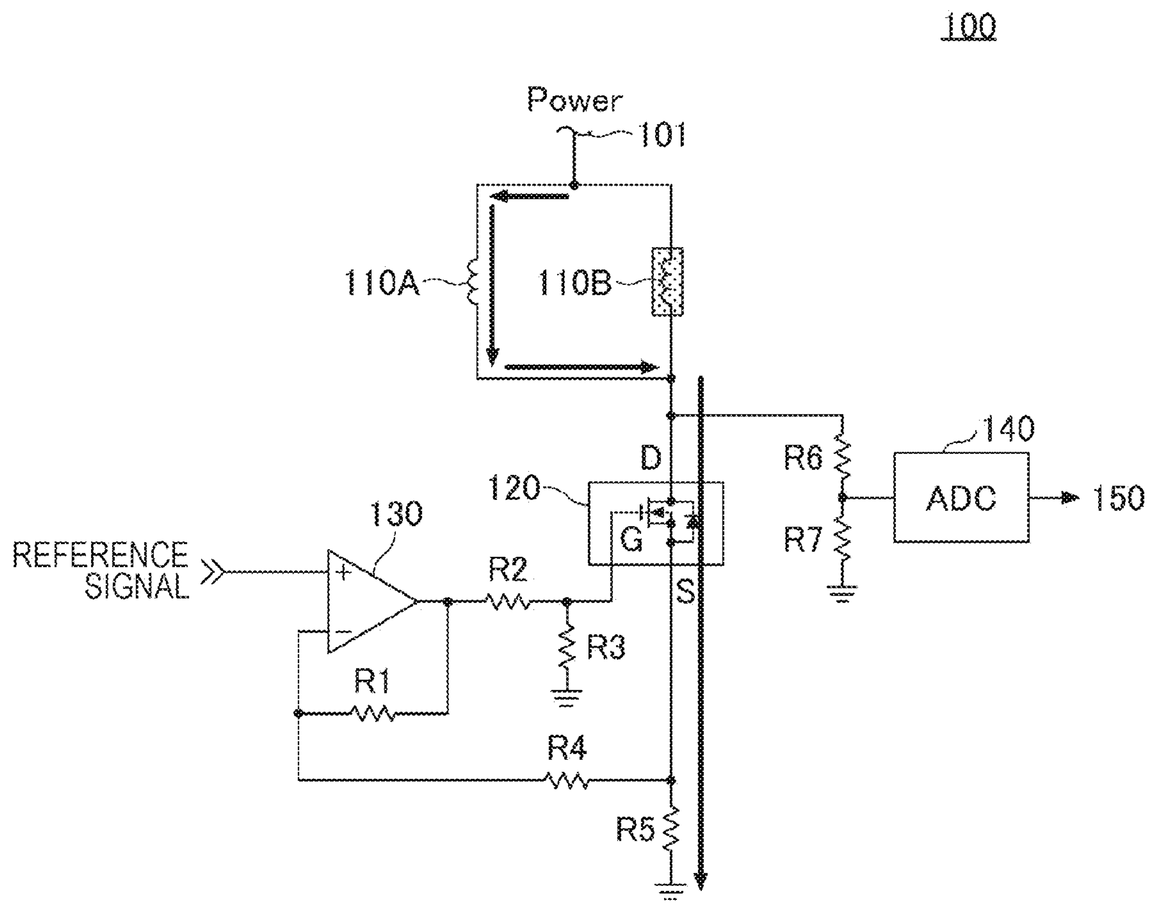
FIG. 2B illustrates the flow of currents in a state in which an open failure has occurred in an actuator.

FIG. 2B illustrates the flow of currents in a state in which an open failure has occurred in the actuator 110B. If the FET 120 is driven when an open failure has occurred in the actuator 110B while the actuator 110A is in the normal state, all currents pass through the actuator 110A as illustrated in FIG. 2B. The value of the combined resistance between the power supply terminal 101 and the FET 120 when currents flow only in the actuator 110A as illustrated in FIG. 2B is increased when compared with a state in which currents flow in the actuators 110A and 110B, which are parallel, as illustrated in FIG. 2A. Therefore, the voltage at the drain terminal of the FET 120 drops, so the value of the voltage entered from the ADC 140 into the microcontroller 150 drops. Thus, the failure diagnosis unit 152 can decide that an open failure has occurred in the actuator 110A or 110B.

Flow of Currents when the Actuator 110A is in the Short Failure State

Figure 2C:
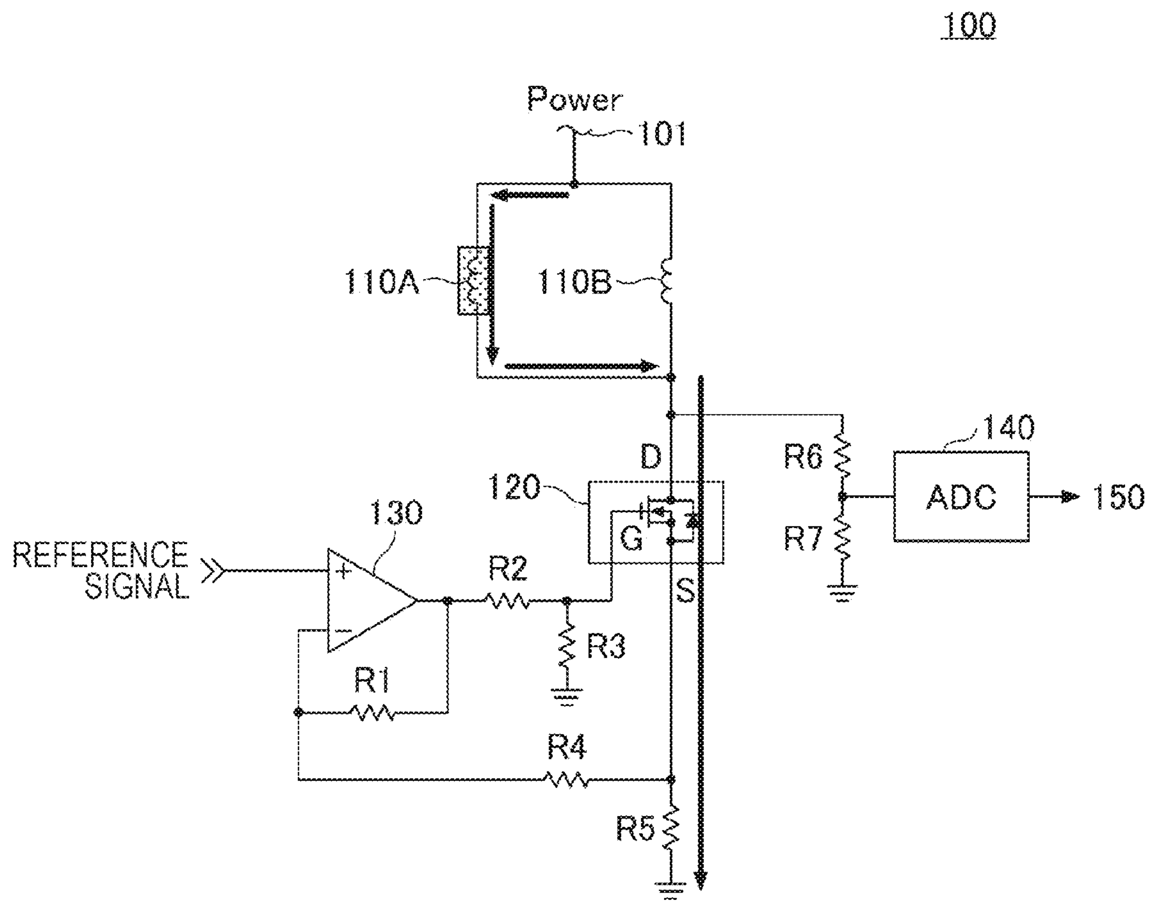
FIG. 2C illustrates the flow of currents in a state in which a short failure has occurred in another actuator.

FIG. 2C illustrates the flow of currents in a state in which a short failure has occurred in the actuator 110A. If the FET 120 is driven when a short failure has occurred in the actuator 110A while the actuator 110B is in the normal state, all currents pass through the actuator 110A as illustrated in FIG. 2C. When the actuator 110A causes a short as illustrated in FIG. 2C, a short-circuit occurs between the power supply terminal 101 and the FET 120 and the voltage at the drain terminal of the FET 120 is increased when compared with a state in which currents flow in the actuators 110A and 110B, which are parallel, as illustrated in FIG. 2A. Therefore, the value of the voltage entered from the ADC 140 into the microcontroller 150 is increased. Thus, the failure diagnosis unit 152 can decide that a short failure has occurred in the actuator 110A or 110B.

Voltages Applied to the Actuators 110A and 110B During Failure Diagnosis When currents flow in the actuators 110A and 110B, failure diagnosis can be performed as explained with reference to FIGS. 2A to 2C. However, if the actuators 110A and 110B are driven during failure diagnosis for the actuators 110A and 110B, the manipulation portion of an input device or the like that incorporates the electronic device 100 vibrates, and unnecessary tactile sense is thereby given to the user.

In view of this, during failure diagnosis, the electronic device 100 sets the voltage value of the reference signal for failure diagnosis so that the voltages to be applied to the actuators 110A and 110B become predetermined voltages lower than operating voltages on which the actuators 110A and 110B operate. Then, the actuators 110A and 110B are not caused to be driven while currents flow in the actuators 110A and 110B and failure diagnosis is performed, so the manipulation portion of an input device or the like that incorporates the electronic device 100 is not caused to vibrate, preventing unnecessary tactile sense from being given to the user. The operating voltages are the lower limits of voltages on which the actuators 110A and 110B can operate.

Figure 3A:
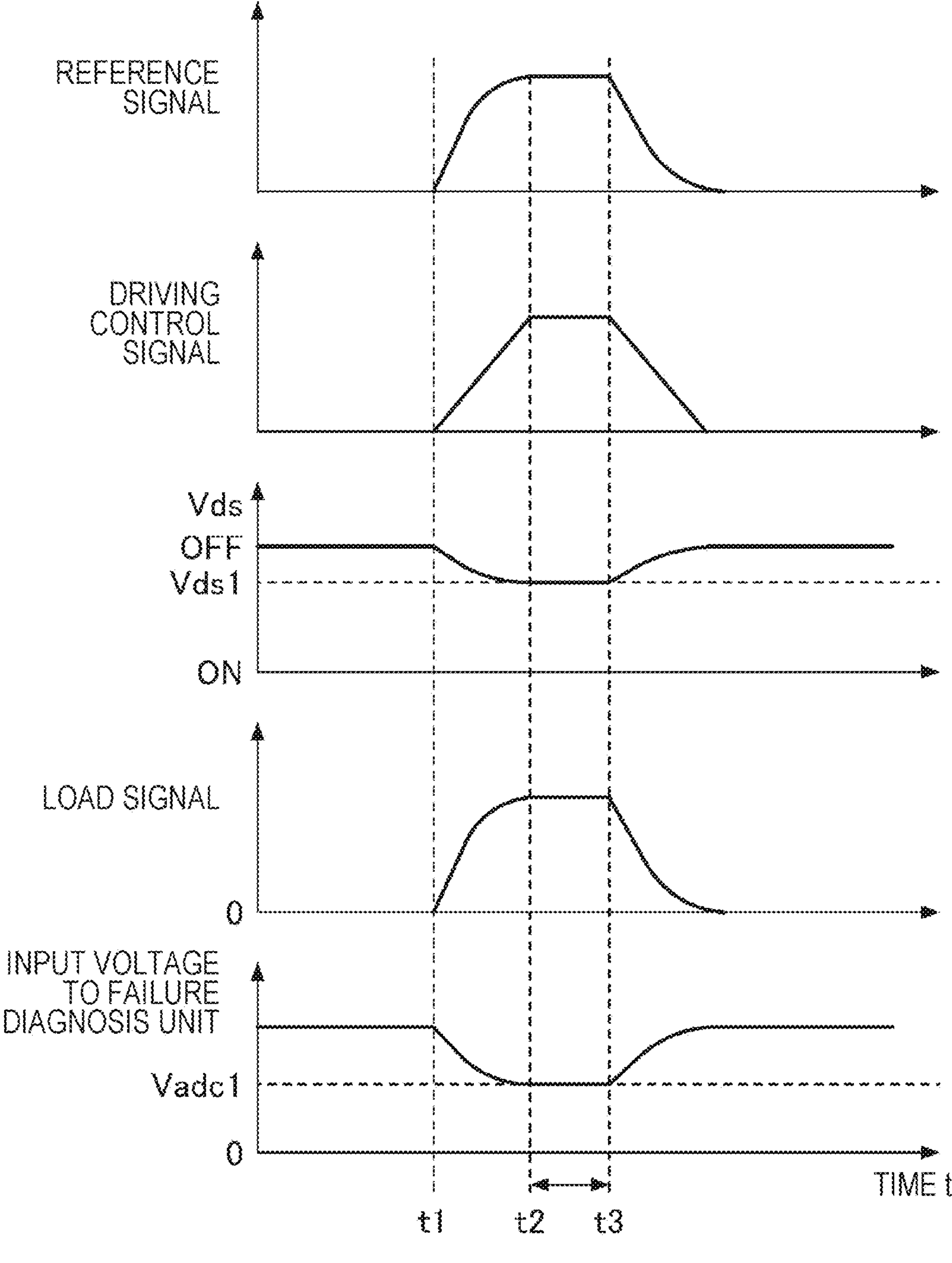
FIG. 3A illustrates voltage waveforms at individual units in the electronic device when failure diagnosis was performed while the actuators were in the normal state.

Voltage Waveforms at Individual Units During Failure Diagnosis in the Normal State FIG. 3A illustrates voltage waveforms at individual units in the electronic device 100 when failure diagnosis was performed while the actuators 110A and 110B were in the normal state. In FIG. 3A, the horizontal axis represents time and the vertical axis represents voltage value. FIG. 3A illustrates examples of the waveforms of the reference signal, the driving control signal, a drain-source voltage Vds at the FET 120, the load signal, and the input voltage to the failure diagnosis unit 152. The input voltage to the failure diagnosis unit 152 is entered from the ADC 140 into the microcontroller 150. The levels of the drain-source voltage Vds in the turned-on (ON) state and turned-off state (OFF) of the FET 120 are indicated by ON and OFF.

When the reference signal goes high at time t1, the driving control signal also starts to go high and the drain-source voltage Vds starts to drop. At time t1, the load signal starts to go high and the input voltage to the failure diagnosis unit 152 starts to drop due to the drop of the drain-source voltage Vds.

When the reference signal completely goes high at time t2, the driving control signal also completely goes high and the drain-source voltage Vds drops to Vds1. At time t2, the load signal completely goes high and the input voltage to the failure diagnosis unit 152 starts to drop to Vadc1.

When the reference signal starts to go low at time t3, the driving control signal also starts to go low and the drain-source voltage Vds starts to increase. At time t3, the load signal starts to go low and the input voltage to the failure diagnosis unit 152 starts to increase due to the increase of the drain-source voltage Vds.

As described above, Vds1 at the time of the drop of the drain-source voltage Vds is close to the voltage value when the FET 120 is in the turned-off state, so the FET 120 is not completely turned on and a current flowing between the drain terminal and source terminal of the FET 120 during failure diagnosis is very small. When the drain-source voltage Vds drops to Vds1, the predetermined voltages lower than the operating voltages are applied to the actuators 110A and 110B, so the actuators 110A and 110B do not operate. Thus, failure diagnosis can be performed without causing the actuators 110A and 110B to operate.

A relatively long time from about several tens of milliseconds to about several seconds can be taken as a period from time t2 to time t3, so an adequately long time is assured for failure diagnosis, making it possible to suppress a mistaken decision.

Figure 3B:
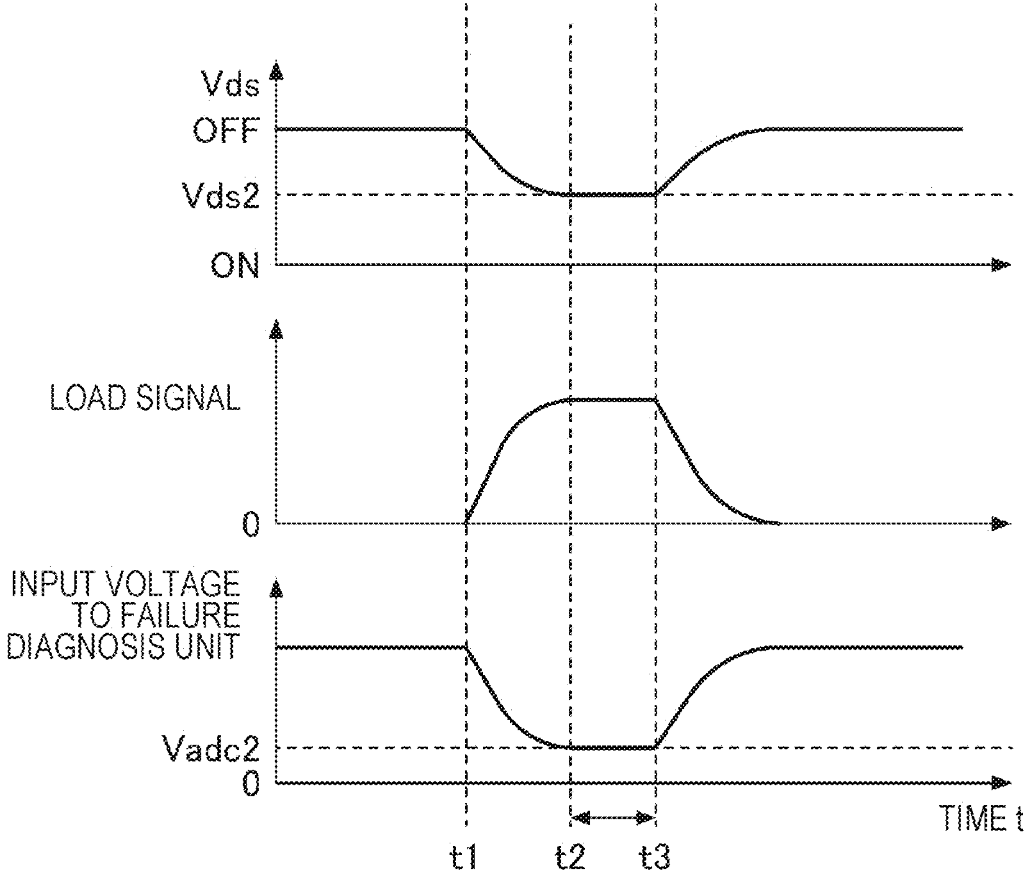
FIG. 3B illustrates voltage waveforms at individual units in the electronic device when failure diagnosis was performed while one of the actuators was in an open failure state.

Voltage Waveforms at Individual Units During Failure Diagnosis in the Open Failure State FIG. 3B illustrates voltage waveforms at individual units in the electronic device 100 when failure diagnosis was performed while one of the actuators 110A and 110B was in the open failure state. In FIG. 3B, the horizontal axis represents time and the vertical axis represents voltage value. FIG. 3B illustrate examples of the waveforms of the drain-source voltage Vds of the FET 120, the load signal, and the input voltage to the failure diagnosis unit 152. The reference signal and driving control signal are the same as in FIG. 3A, so they are not illustrated. In the description below, it will be assumed that an open failure has occurred in the actuator 110B as illustrated in FIG. 2B. However, the same is true when an open failure occurs in the actuator 110A.

When the reference signal (see FIG. 3A) goes high at time t1, the driving control signal (see FIG. 3A) also starts to go high and the drain-source voltage Vds starts to drop. At time t1, the load signal starts to go high and the input voltage to the failure diagnosis unit 152 starts to drop due to the drop of the drain-source voltage Vds.

When the reference signal completely goes high at time t2, the driving control signal also completely goes high and the drain-source voltage Vds drops to Vds2. At this time, since there is an open failure in the actuator 110B, the value of the resistance between the power supply terminal 101 and the drain terminal of the FET 120 is higher than when the actuators 110A and 110B are in the normal state. Therefore, the drain terminal voltage of the FET 120 is lower than in the normal state. Thus, the drain-source voltage Vds2 at time t2 is lower than the drain-source voltage Vds1 illustrated in FIG. 3A. At time t2, the load signal completely goes high and the input voltage to the failure diagnosis unit 152 starts to drop to Vadc2. Since the amount of drop of the drain-source voltage Vds is greater when compared with FIG. 3A, the input voltage Vadc2 to the failure diagnosis unit 152 is lower than the input voltage Vadc1, illustrated in FIG. 3A, of the failure diagnosis unit 152.

When the reference signal starts to go low at time t3, the driving control signal also starts to go low and the drain-source voltage Vds starts to increase. At time t3, the load signal starts to go low and the input voltage to the failure diagnosis unit 152 starts to increase due to the increase of the drain-source voltage Vds.

As described above, the input voltage Vadc2 to the failure diagnosis unit 152 at the time of the occurrence of an open failure in the actuator 110B is lower than the input voltage Vadc1 to the failure diagnosis unit 152 in the normal state, so the failure diagnosis unit 152 can decide that there is an open failure, according to these input voltages.

Figure 3C:
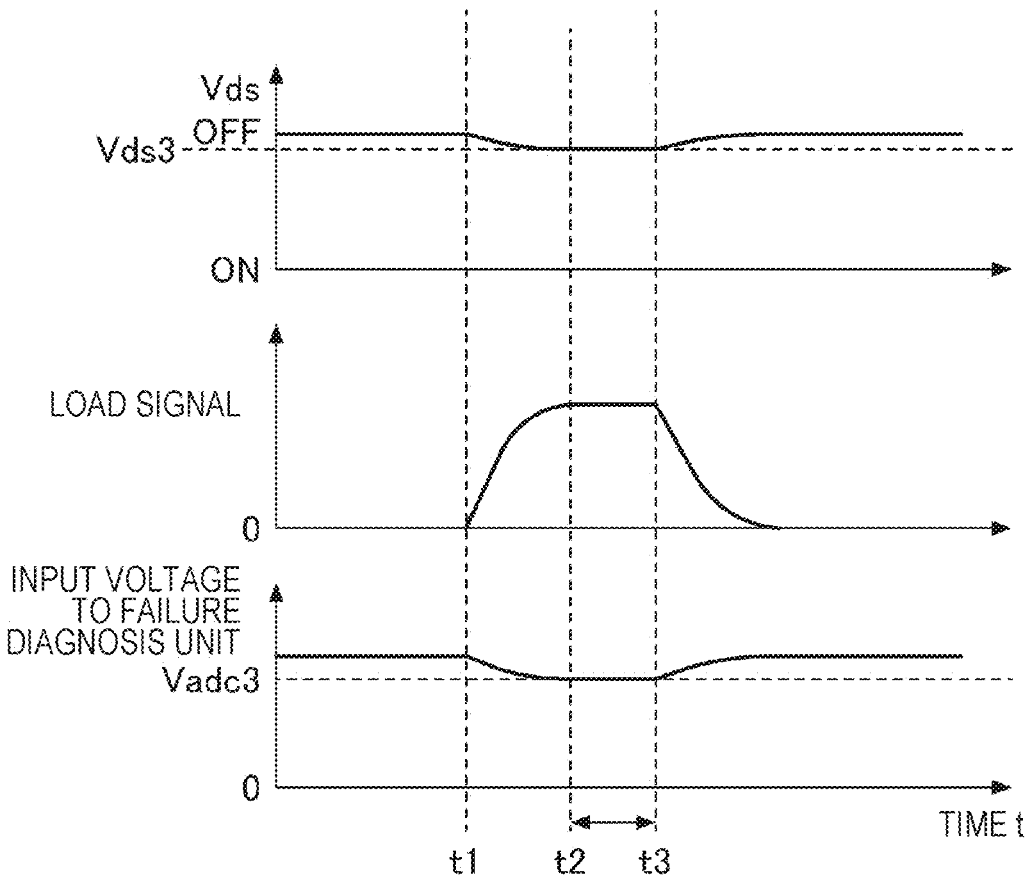
FIG. 3C illustrates voltage waveforms at individual units in the electronic device when failure diagnosis was performed while one of the actuators was in a short failure state.

Voltage Waveforms at Individual Units During Failure Diagnosis in the Short Failure State FIG. 3C illustrates voltage waveforms at individual units in the electronic device 100 when failure diagnosis was performed while one of the actuators 110A and 110B was in the short failure state. In FIG. 3C, the horizontal axis represents time and the vertical axis represents voltage value. FIG. 3C illustrate examples of the waveforms of the drain-source voltage Vds of the FET 120, the load signal, and the input voltage to the failure diagnosis unit 152. The reference signal and driving control signal are the same as in FIG. 3A, so they are not illustrated. In the description below, it will be assumed that a short failure has occurred in the actuator 110A as illustrated in FIG. 2C. However, the same is true when a short failure occurs in the actuator 110B.

When the reference signal (see FIG. 3A) goes high at time t1, the driving control signal (see FIG. 3A) also starts to go high and the drain-source voltage Vds starts to drop. At time t1, the load signal starts to go high and the input voltage to the failure diagnosis unit 152 starts to drop due to the drop of the drain-source voltage Vds.

When the reference signal completely goes high at time t2, the driving control signal also completely goes high and the drain-source voltage Vds drops to Vds3. At this time, since there is a short failure in the actuator 110A, a short-circuit occurs between the power supply terminal 101 and the drain terminal of the FET 120 unlike when the actuators 110A and 110B are in the normal state. Therefore, the drain terminal voltage of the FET 120 becomes higher than in the normal state. Thus, the drain-source voltage Vds3 at time t2 is higher than the drain-source voltage Vds1 illustrated in FIG. 3A. At time t2, the load signal completely goes high and the input voltage to the failure diagnosis unit 152 starts to drop to Vadc3. Since the amount of drop of the drain-source voltage Vds is smaller when compared with FIG. 3A, the input voltage Vadc3 to the failure diagnosis unit 152 is higher than the input voltage Vadc1, illustrated in FIG. 3A, to the failure diagnosis unit 152.

When the reference signal starts to go low at time t3, the driving control signal also starts to go low and the drain-source voltage Vds starts to increase. At time t3, the load signal starts to go low and the input voltage to the failure diagnosis unit 152 starts to increase due to the increase of the drain-source voltage Vds.

As described above, the input voltage Vadc3 to the failure diagnosis unit 152 at the time of the occurrence of a short failure in the actuator 110A is higher than the input voltage Vadc1 to the failure diagnosis unit 152 in the normal state, so the failure diagnosis unit 152 can decide that there is a short failure, according to these input voltages.

Failure diagnosis by the failure diagnosis unit 152

Figures 4, 5:
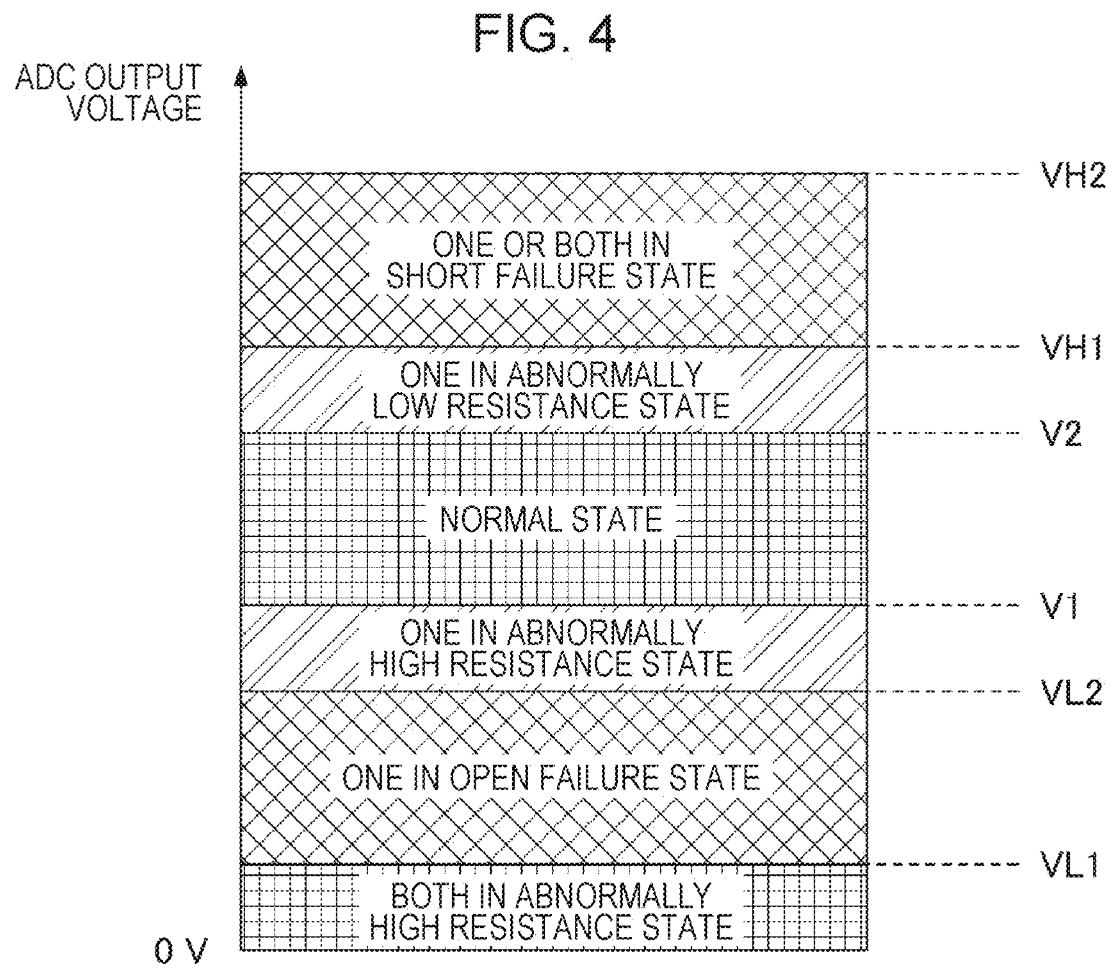
FIG. 4 illustrates voltage data used by a failure diagnosis unit in failure diagnosis.
FIG. 5 is a flowchart illustrating failure diagnosis processing executed by the failure diagnosis unit.

FIG. 4 illustrates voltage data used by the failure diagnosis unit 152 in failure diagnosis. Voltage values included in the voltage data illustrated in FIG. 4 are obtained in simulation. The voltage data is stored in the memory 153.

The input voltage to the failure diagnosis unit 152 is a voltage output by the ADC 140 to the microcontroller 150. If the output voltage from the ADC 140 is higher than or equal to V1 and lower than or equal to V2, the failure diagnosis unit 152 decides that the actuators 110A and 110B are in the normal state. V1 is lower than V2, and V1 and V2 are a positive voltage. The input voltage Vadc1, illustrated in FIG. 3A (representing the normal state), to the failure diagnosis unit 152 is higher than or equal to V1 and lower than or equal to V2.

If the output voltage from the ADC 140 is outside the range from V1 to V2, the failure diagnosis unit 152 decides that a failure has occurred. A failure is an open failure, a short failure, or another abnormal state in the actuator 110A or 110B. Another failure is, for example, an abnormally high resistance state or abnormally low resistance state of the actuator 110A or 110B. When the failure diagnosis unit 152 decides that a failure has occurred, the failure diagnosis unit 152 notifies a high-end control unit such as an input device that incorporates the electronic device 100.

The failure diagnosis unit 152 does not decide that what type of failure has occurred in the actuator 110A or 110B. However, the failure diagnosis unit 152 may discriminate the state of a failure by suing voltages VL1, VL2, VH1, and VH2 as described below, besides the voltages V1 and V2.

If the output voltage from the ADC 140 is lower than V1 and higher than or equal to VL2, the failure diagnosis unit 152 decides that any one of the actuators 110A and 110B is in the abnormally high resistance state. VL2 is lower than V1, and VL2 is a positive voltage. In the abnormally high resistance state, there is no wire breakage in the actuator 110A or 110B but the resistance value is very higher than in the normal state because there is damage to a wire or like.

If the output voltage from the ADC 140 is lower than VL2 and is higher than or equal to VL1, the failure diagnosis unit 152 decides that any one of the actuators 110A and 110B is in the open failure state. VL1 is lower than VL2, and VL1 is a positive voltage. The input voltage Vadc2, illustrated in FIG. 3B (representing the open state), to the failure diagnosis unit 152 is lower than VL2 and higher than or equal to VL1.

If the output voltage from the ADC 140 is lower than VL1, the failure diagnosis unit 152 decides that both of the actuators 110A and 110B are in the abnormally high resistance state.

If the output voltage from the ADC 140 is higher than V2 and is lower than or equal to VH1, the failure diagnosis unit 152 decides that any one of the actuators 110A and 110B is in the abnormally low resistance state. VH1 is higher than V2. In the abnormally low stance state, the actuator 110A or 110B is not short-circuited but the resistance value is very lower than in the normal state because there is damage to a wire or like.

If the output voltage from the ADC 140 is higher than VH1 and is lower than or equal to VH2, the failure diagnosis unit 152 decides that any one or both of the actuators 110A and 110B are in the short failure state. VH1 is higher than VH2. The input voltage Vadc3, illustrated in FIG. 3C (representing the short state), to the failure diagnosis unit 152 is higher than VH1 and lower than or equal to VH2.

Voltage data representing the voltage values V1 and V2 or voltage data representing the voltage values VL1, VL2, V1, V2, VH1, and VH2 is stored in the memory 153. The failure diagnosis unit 152 reads voltage data from the memory 153, compares the voltage data with the output voltage from the ADC 140, and performs failure diagnosis.

Failure Diagnosis Processing

FIG. 5 is a flowchart illustrating failure diagnosis processing executed by the failure diagnosis unit 152. The failure diagnosis unit 152 repeatedly executes processing illustrated in FIG. 5. The failure diagnosis unit 152 reads voltage data from the memory 153 in advance.

The failure diagnosis unit 152 acquires the output voltage from the ADC 140 (step S1).

The failure diagnosis unit 152 compares the acquired output voltage from the ADC 140 with the voltage values V1 and V2 included in the voltage data (step S2).

The failure diagnosis unit 152 performs failure diagnosis according to the comparison result (step S3). If the output voltage from the ADC 140 is higher than or equal to V1 and lower than or equal to V2, the failure diagnosis unit 152 decides that the actuators 110A and 110B are in the normal state. If the output voltage from the ADC 140 is outside the range from Vito V2, the failure diagnosis unit 152 decides that a failure has occurred.

The failure diagnosis unit 152 terminates the series of processing (END). The failure diagnosis unit 152 repeatedly executes processing from START to END at predetermined intervals or at predetermined timings.

The failure diagnosis unit 152 may use the voltages L1, VL2, V1, V2, VH1, and VH2 to decide whether the actuators 110A and 110B are in the normal state, any one of them is in the abnormally high resistance state, any one of them is in the open failure state, both of them are in the abnormally high resistance state, any one of them is in the abnormally low resistance state, or one or both of them are in the short failure state.

As described above, the ope-amplifier 130, which drives the FET 120, outputs, to the FET 120, the driving control signal that represents a result of comparison between the load signal resulting from converting a current flowing in the current path to a voltage and the reference signal used as a reference for the operation of the FET 120; and if the failure diagnosis unit 152 detects a voltage outside a normal voltage range, the failure diagnosis unit 152 decides that the actuator 110A or 110B is in the abnormal state.

Thus, the FET 120 is turned on by the driving control signal in a series of steps, so even if the actuator 110A or 110B has a failure, the current flowing in the FET 120 can be suppressed and damage to the FET 120 can be thereby prevented.

Therefore, it is possible to provide the electronic device 100 that can perform failure diagnosis for the actuator 110A or 110B and can suppress damage to the FET 120.

Also, the failure diagnosis unit 152 decides whether the actuator 110A or 110B is in the abnormal state or normal state. The abnormal state indicates an open failure or short failure in the actuator 110A or 110B. Thus, it is possible to detect a failure in the actuator 110A or 110B, according the voltage of the actuator 110A or 110B.

The voltage, detected by the failure diagnosis unit 152, of the actuator 110A or 110B may be such that the normal voltage of the actuator 110A or 110B in the normal state is higher than the open voltage of the actuator 110A or 110B in the open failure state and that the short voltage of the actuator 110A or 110B in the short failure state is higher than the normal voltage. Thus, it is possible to detect an open failure and short failure in the actuator 110A or 110B, according the voltage of the actuator 110A or 110B.

The failure diagnosis unit 152 may perform failure diagnosis according to voltages in the current paths between a plurality of actuators 110A and 110B and the FET 120. Therefore, the failure diagnosis unit 152 can detect a failure in the actuator 110A or 110B according to the voltage of the actuator 110A or 110B, the voltage being obtained through the current paths.

When performing failure diagnosis, the failure diagnosis unit 152 may set the voltage of the reference signal so that predetermined voltages lower than the operating voltages on which the actuators 110A and 110B operate are applied to the plurality of actuators 110A and 110B. Therefore, the failure diagnosis unit 152 can perform failure diagnosis without causing the actuators 110A and 110B to operate.

An aspect has been described above in which the failure diagnosis unit 152 decides that an open failure, a short failure, or another abnormal state (abnormally high resistance state or abnormally low resistance state, for example) has occurred in a plurality of actuators 110A and 110B, according to the output voltage from the ADC 140. However, in a case as well in which, for example, the electronic device 100 includes only any one of the actuators 110A and 110B, if an open failure, a short failure, or another abnormal state (abnormally high resistance state or abnormally low resistance state, for example) occurs, the output voltage from the ADC 140 changes. Thus, the electronic device 100 may be structured so as to include only one actuator. It suffices for the failure diagnosis unit 152 to decide that an open failure, a short failure, or another abnormal state (abnormally high resistance state or abnormally low resistance state, for example) has occurred in the one actuator, according to the output voltage from the ADC 140.

Embodiment 2

Structure of an Electronic Device 200

Figure 6:
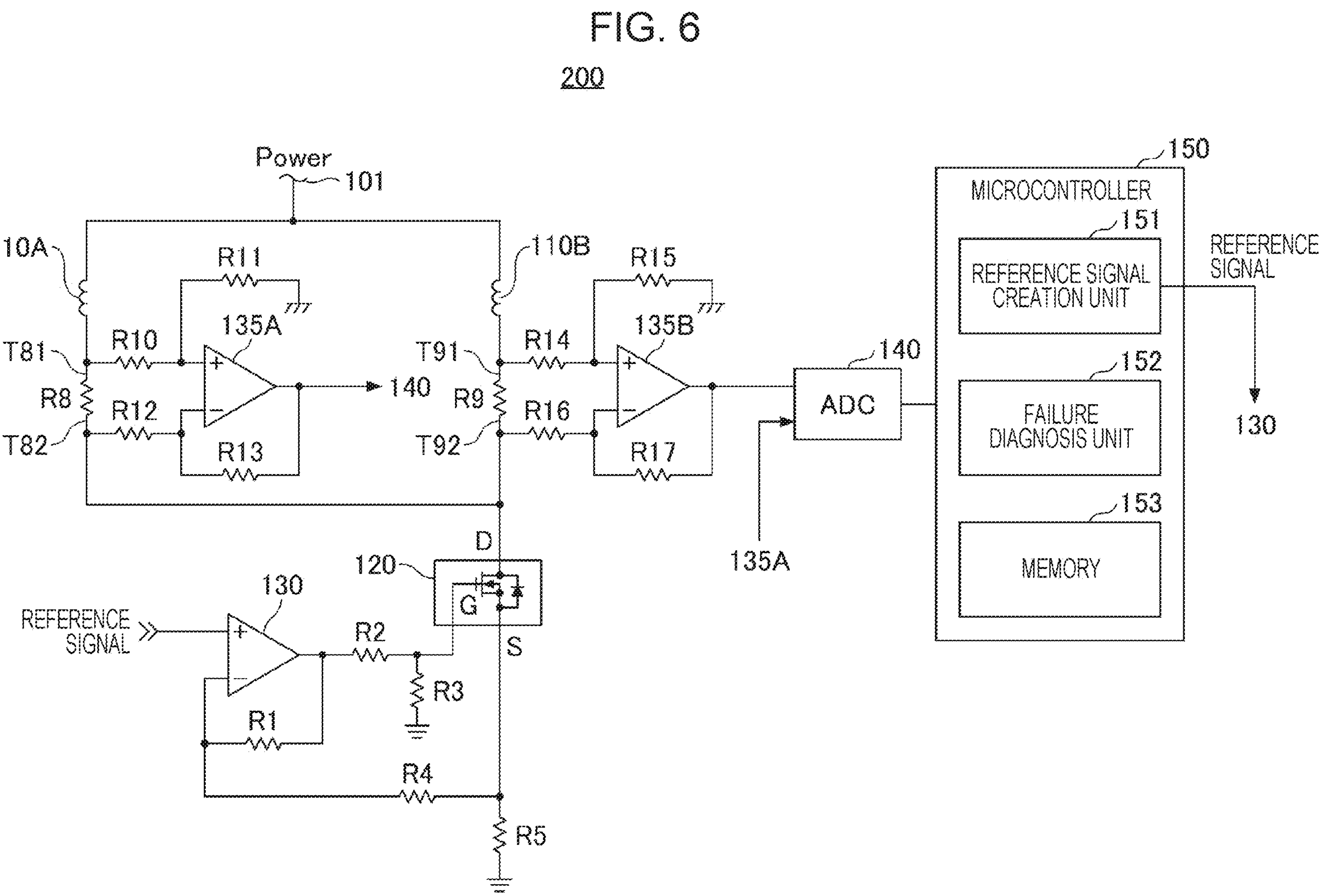
FIG. 6 illustrates is an electronic device in embodiment 2.

FIG. 6 illustrates is the electronic device 200 in embodiment 2. The electronic device 200 includes a power supply terminal 101, actuators 110A and 110B, an FET 120, an ope-amplifier 130, amplifiers 135A and 135B, an ADC 140, a microcontroller 150, and resistors R1 to R5 and R8 to R17. Of the constituent elements of the electronic device 200 in embodiment 2, constituent elements that are the same as constituent elements of the electronic device 100 in embodiment 1 will be given the same reference numerals and descriptions will be omitted.

The electronic device 200 in embodiment 2 has a circuit structure in which the resistors R8 and R9, which are respectively connected in series with actuator 110A or 110B, are provided instead of the voltage dividing circuit including the resistors R6 and R7 in the electronic device 100 in embodiment 1, voltages being entered into the ADC 140 through amplifiers 135A and 135B. The resistors R8 and R9 are used in conversion of the currents flowing in the actuators 110A and 110B to voltages. The R8 and R9 have the same resistance value. The resistors R10 and R17 are connected to the periphery of the amplifiers 135A and 135B.

Specific descriptions will be given below. A terminal, connected to the actuator 110A, of the resistor R8 will be denoted T81. A terminal, connected to the drain terminal of the FET 120, of the resistor R8 will be denoted T82. A terminal, connected to the actuator 110B, of the resistor R9 will be denoted T91. A terminal, connected to the drain terminal of the FET 120, of the resistor R9 will be denoted T92. The terminal T81 is an example of a first terminal of the resistor R8. The terminal T82 is an example of a second terminal of the resistor R8. The terminal T91 is an example of a first terminal of the resistor R9. The terminal T92 is an example of a second terminal of the resistor R9.

The resistor R10 is connected between the terminal T81 and the non-inverting input terminal of the amplifier 135A. The resistor R12 is connected between the terminal T82 and the inverting input terminal of the amplifier 135A. One end of the resistor R11 is connected between the resistor R10 and the non-inverting input terminal of the amplifier 135A. Another end of the resistor R11 is grounded. The resistor R13 is connected between the output terminal and inverting input terminal of the amplifier 135A as a negative feed-back resistor. The output terminal of the amplifier 135A is connected to one of the two input terminals of the ADC 140.

The resistor R14 is connected between the terminal T91 and the non-inverting input terminal of the amplifier 135B. The resistor R16 is connected between the terminal T92 and the inverting input terminal of the amplifier 135B. One end of the resistor R15 is connected between the resistor R14 and the non-inverting input terminal of the amplifier 135B. Another end of the resistor R15 is grounded. The resistor R17 is connected between the output terminal and inverting input terminal of the amplifier 135B as a negative feed-back resistor. The output terminal of the amplifier 135B is connected to the other of the two input terminals of the ADC 140.

The ADC 140 converts the values of voltages output from the amplifiers 135A and 135B to digital voltage values and outputs them to the microcontroller 150. The failure diagnosis unit 152 in the microcontroller 150 in embodiment 2 performs failure diagnosis according to the two voltage values resulting from amplification in the amplifiers 135A and 135B and subsequent digital conversion in the ADC 140.

The values of the voltages output from the amplifiers 135A and 135B are respectively adjusted by using the resistors R10 to R13 and resistors R14 to R17 so that a difference occurs in the voltages applied to the actuators 110A and 110B between the normal state and the abnormal state.

The failure diagnosis unit 152 performs failure diagnosis for the actuators 110A and 110B according to two voltages entered from the ADC 140. The two voltages entered from the ADC 140 represent voltages applied to the actuators 110A and 110B, which are two loads. The memory 153 stores voltage data used by the electronic device 200 in the embodiment 2, besides programs and data that are needed for the reference signal creation unit 151 to perform creation processing for the reference signal as well as program and data needed for the failure diagnosis unit 152 to perform failure diagnosis.

Flow of Currents in the Normal State

Figure 7A:
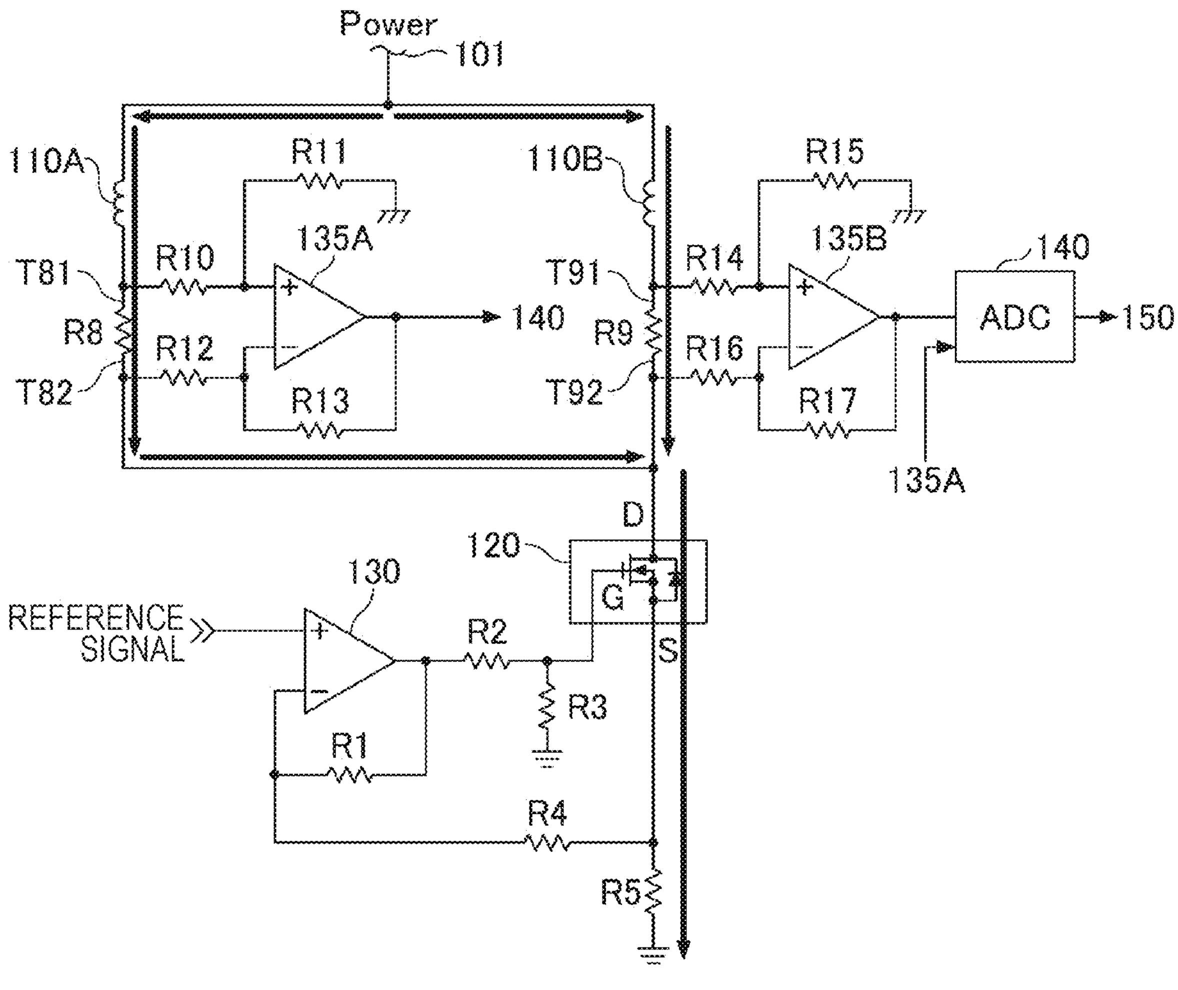
FIG. 7A illustrates flows of currents in the normal state.

FIG. 7A illustrates flows of currents in the normal state. When the actuators 110A and 110B are in the normal state, currents flow from the power supply terminal 101, pass through the actuators 110A and 110B and FET 120, and flow toward the resistor R5, as illustrated by the arrows in FIG. 7A.

Flow of Currents when the Actuator 110B is in the Open Failure State

Figure 7B:
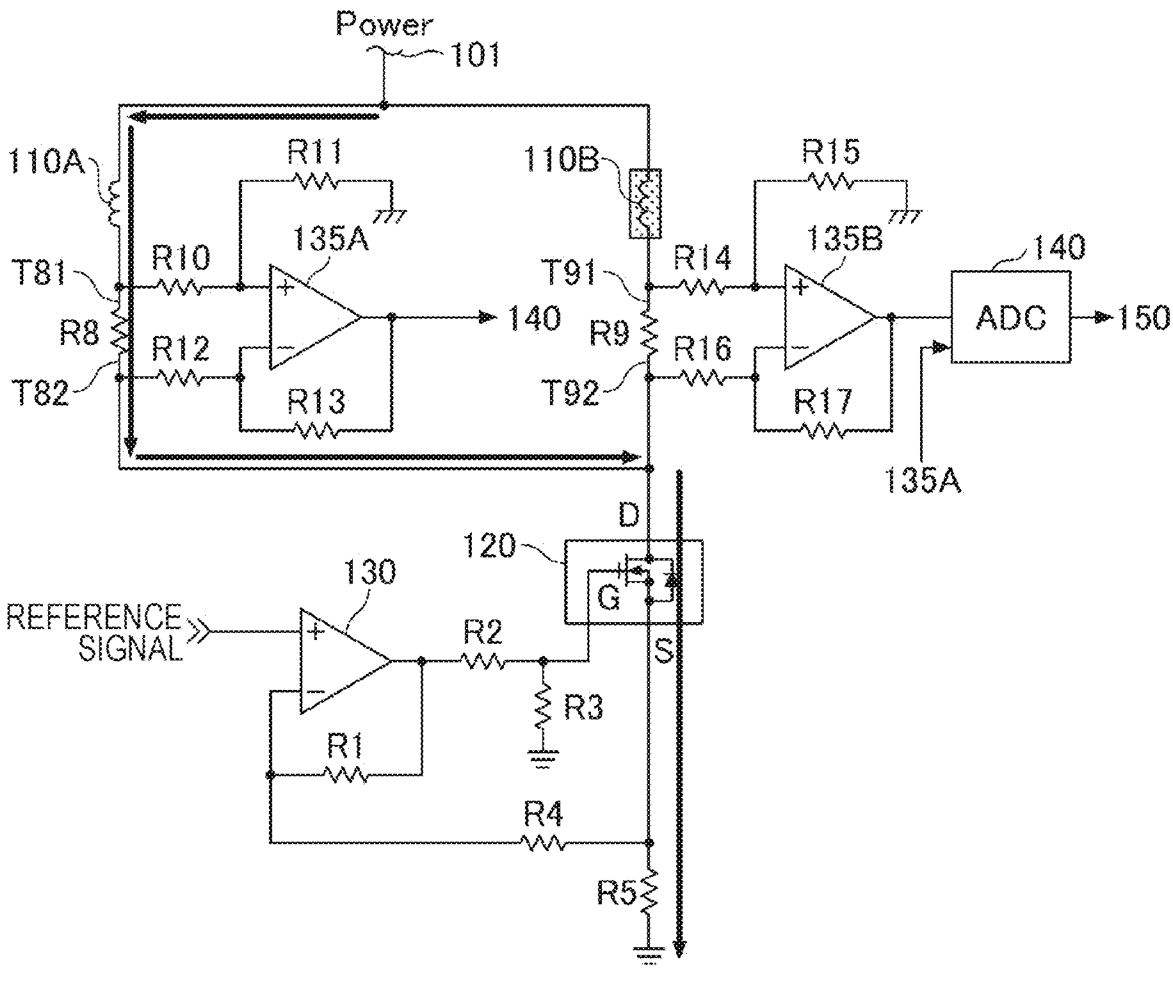
FIG. 7B illustrates the flow of currents in a state in which an open failure has occurred in an actuator.

FIG. 7B illustrates the flow of currents in a state in which an open failure has occurred in the actuator 110B. If the FET 120 is driven when the actuator 110A is in the normal state and an open failure has occurred in the actuator 110B, all currents pass through the actuator 110A and no current flows in the actuator 110B, as illustrated in FIG. 7B. Thus, a voltage across the terminals of the resistor R8 connected in series with the actuator 110A becomes higher than in the normal state, and a voltage across the terminals of the resistor R9 connected in series with the actuator 110B becomes 0 V. According to this type of changes in voltage, the failure diagnosis unit 152 can decide that an open failure has occurred in the actuator 110A or 110B.

Flow of Currents when the Actuator 110A is in the Short Failure State

Figure 7C:
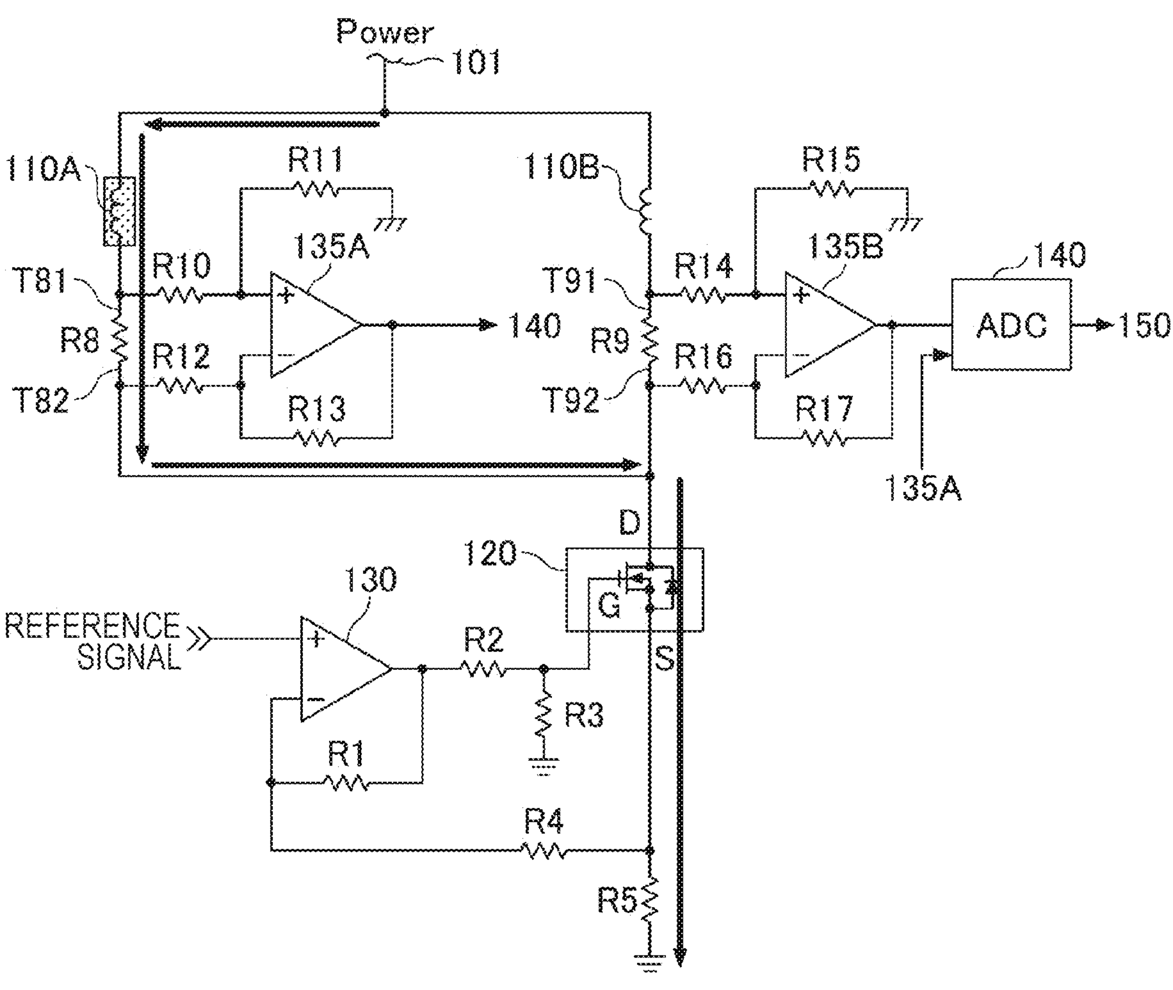
FIG. 7C illustrates the flow of currents in a state in which a short failure has occurred in another actuator.

FIG. 7C illustrates the flow of currents in a state in which a short failure has occurred in the actuator 110A. If the FET 120 is driven when the actuator 110B is in the normal state and a short failure has occurred in the actuator 110A, all currents pass through the actuator 110A as illustrated in FIG. 7C. Thus, a voltage across the terminals of the resistor R8 connected in series with the actuator 110A becomes higher than in the normal state, and a voltage across the terminals of the resistor R9 connected in series with the actuator 110B greatly drops when compared with the normal state because the current becomes about 0. According to this type of changes voltage, the failure diagnosis unit 152 can decide that a short failure has occurred in the actuator 110A or 110B.

Voltages Applied to the Actuators 110A and 110B During Failure Diagnosis When currents flow in the actuators 110A and 110B, failure diagnosis can be performed as explained with reference to FIGS. 7A to 7C. When performing failure diagnosis, the electronic device 200 sets the voltage value of the reference signal for failure diagnosis so that the voltages to be applied to the actuators 110A and 110B become predetermined voltages lower than the operating voltages on which the actuators 110A and 110B operate, as with the electronic device 100 in embodiment 1. Then, the actuators 110A and 110B are not cause to be driven while currents flow in the actuators 110A and 110B and failure diagnosis is performed, so the manipulation portion of an input device or the like that incorporates the electronic device 200 is not caused to vibrate and unnecessary tactile sense is not given to the user.

Figure 8A:
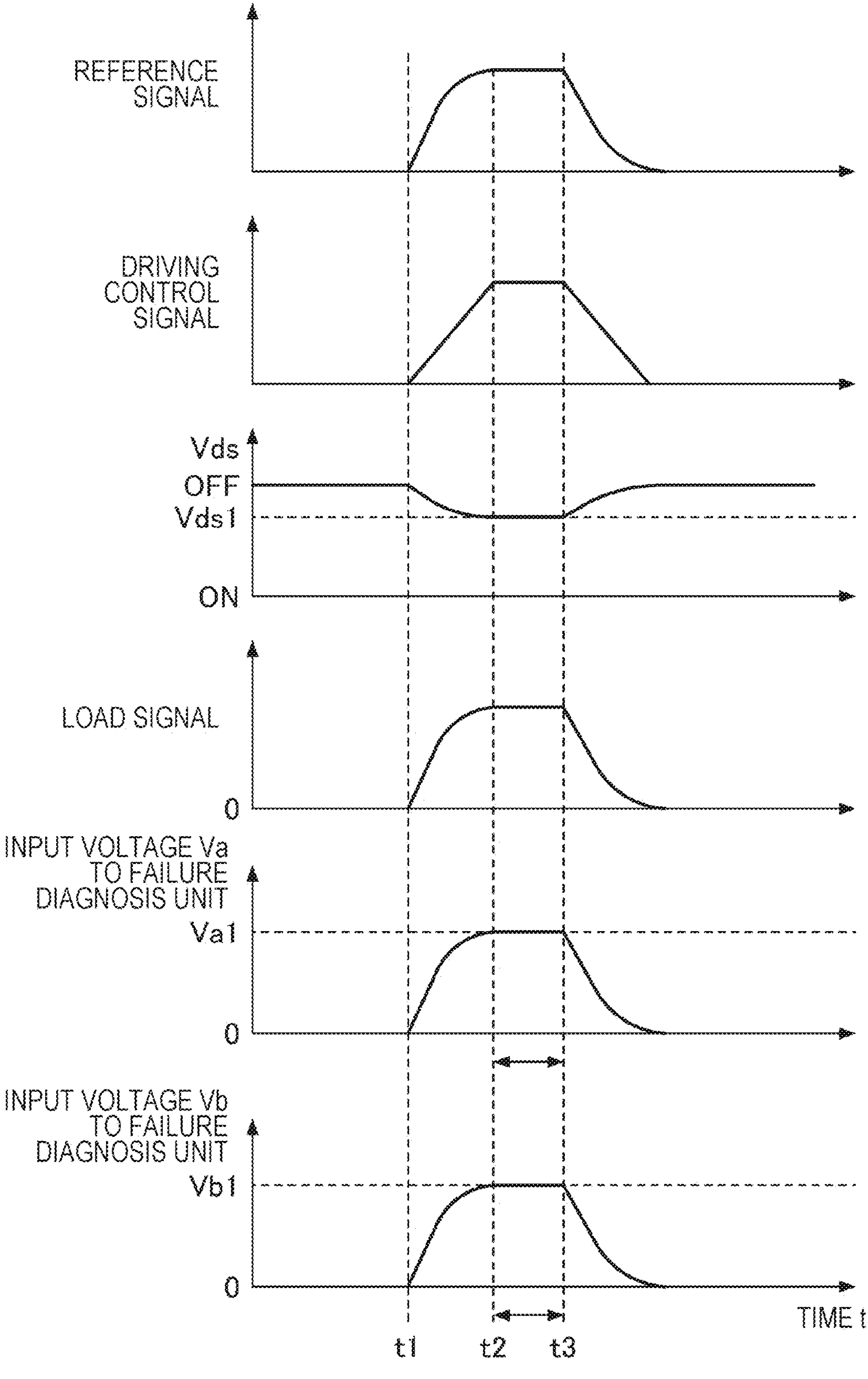
FIG. 8A illustrates voltage waveforms at individual units in the electronic device in embodiment 2 when failure diagnosis was performed while the actuators were in the normal state.

Voltage Waveforms at Individual Units During Failure Diagnosis in the Normal State FIG. 8A illustrates voltage waveforms at individual units in the electronic device 200 when failure diagnosis was performed while the actuators 110A and 110B were in the normal state. In FIG. 8A, the horizontal axis represents time and the vertical axis represents voltage value. FIG. 8A illustrates examples of the waveforms of the reference signal, the driving control signal, the drain-source voltage Vds of the FET 120, the load signal, and two input voltages Va and Vb to the failure diagnosis unit 152. The two input voltages Va and Vb to the failure diagnosis unit 152 are entered from the ADC 140 into the microcontroller 150. The input voltages Va and Vb are voltages that are respectively detected at the resistors R8 and R9. That is, the input voltages Va and Vb are respectively represent the values of the currents flowing in the actuators 110A and 110B. The levels of the drain-source voltage Vds in the turned-on (ON) state and turned-off state (OFF) of the FET 120 are indicated by ON and OFF.

When the reference signal goes high at time t1, the driving control signal also starts to go high and the drain-source voltage Vds starts to drop. At time t1, the load signal starts to go high and currents flow into the actuators 110A and 110B due to the drop of the drain-source voltage Vds. Therefore, the two input voltages Va and Vb to the failure diagnosis unit 152 start to rise.

When the reference signal completely goes high at time t2, the driving control signal also completely goes high and the drain-source voltage Vds drops to Vds1. At time t2, the load signal completely goes high and the two input voltages Va and Vb to the failure diagnosis unit 152 respectively increase to Va1 and Vb1.

When the reference signal starts to go low at time t3, the driving control signal also starts to go low and the drain-source voltage Vds starts to increase. At time t3, the load signal starts to go low and the currents flowing in the actuators 110A and 110B are reduced due to the increase of the drain-source voltage Vds, so the two input voltages Va and Vb to the failure diagnosis unit 152 start to drop.

As described above, Vds1 at the time of the drop of the drain-source voltage Vds is close to the voltage value at the time when the FET 120 is in the turned-off state, so the FET 120 is not completely turned on and a current flowing between the drain terminal and source terminal of the FET 120 during failure diagnosis is very small. When the drain-source voltage Vds drops to Vds1, the predetermined voltages lower than the operating voltages are applied to the actuators 110A and 110B, so the actuators 110A and 110B do not operate. Thus, failure diagnosis can be performed without causing the actuators 110A and 110B to operate. The drain-source voltage Vds1 may not be equal to the drain-source voltage Vds1 in embodiment 1.

Also, a relatively long time from about several tens of milliseconds to about several seconds can be taken as a period from time t2 to time t3, so an adequately long time is assured for failure diagnosis, making it possible to suppress a mistaken decision.

Figure 8B:
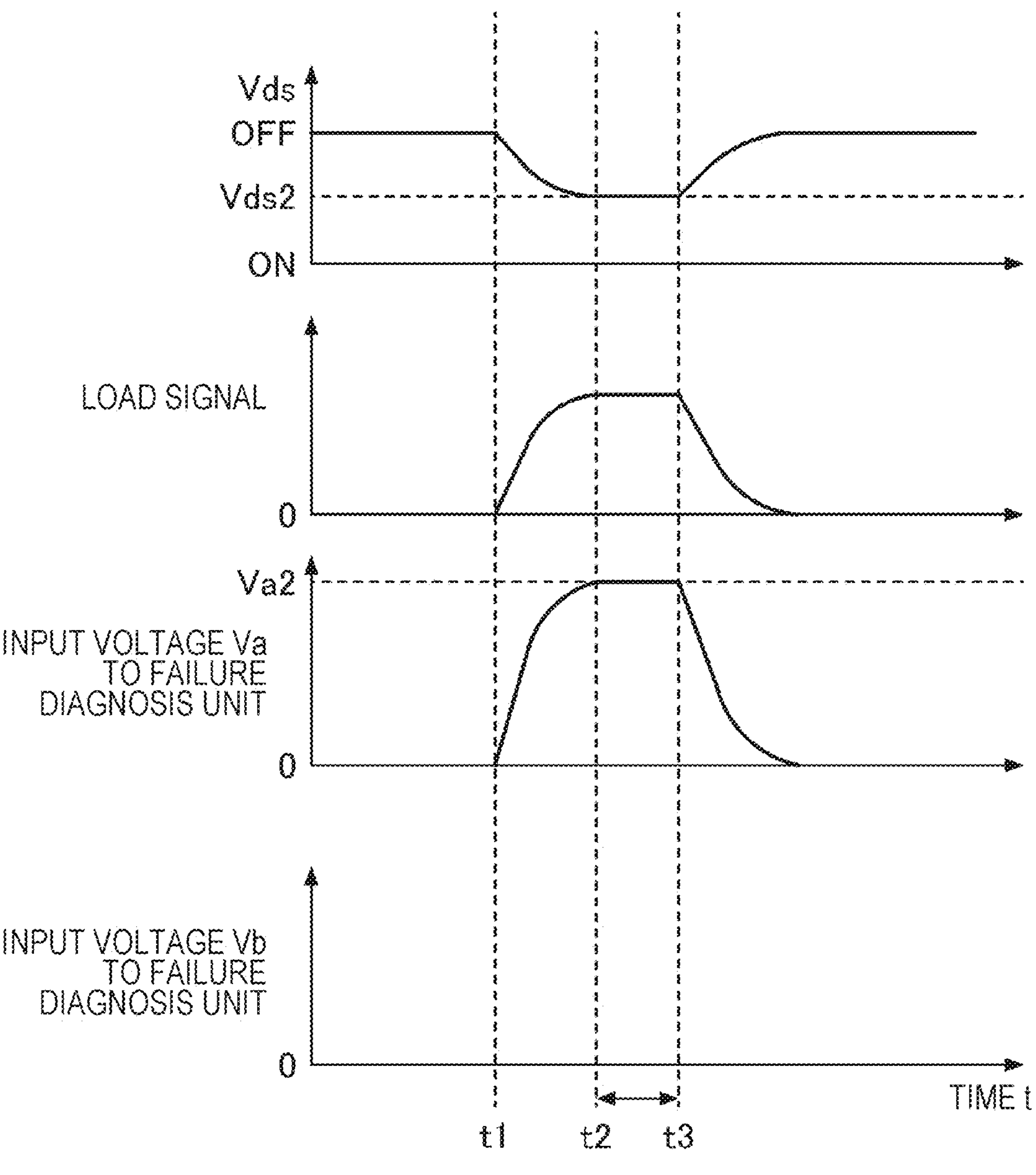
FIG. 8B illustrates voltage waveforms at individual units in the electronic device in embodiment 2 when failure diagnosis was performed while one of the actuators was in the open failure state.

Voltage Waveforms at Individual Units During Failure Diagnosis in the Open Failure State FIG. 8B illustrates voltage waveforms at individual units in the electronic device 200 when failure diagnosis was performed while one of the actuators 110A and 110B was in the open failure state. In FIG. 8B, the horizontal axis represents time and the vertical axis represents voltage value. FIG. 8B illustrates examples of the waveforms of the drain-source voltage Vds of the FET 120, the load signal, and the input voltages to the failure diagnosis unit 152. The reference signal and driving control signal are the same as in FIG. 8A, so they are not illustrated. In the description below, it will be assumed that an open failure has occurred in the actuator 110B as illustrated in FIG. 7B. However, the same is true when an open failure occurs in the actuator 110A.

When the reference signal (see FIG. 8A) goes high at time t1, the driving control signal (see FIG. 8A) also starts to go high and the drain-source voltage Vds starts to drop. At time t1, the load signal starts to go high and the input voltage Va to the failure diagnosis unit 152 starts to rise due to the drop of the drain-source voltage Vds.

When the reference signal completely goes high at time t2, the driving control signal also completely goes high and the drain-source voltage Vds drops to Vds2. At this time, there is an open failure in the actuator 110B, and if the FET 120 is driven, all currents pass through the actuator 110A and no current flows in the actuator 110B. Therefore, the input voltage Va to the failure diagnosis unit 152 becomes Va2, which is higher than Va1 in the normal state, and the input voltage Vb to the failure diagnosis unit 152 becomes 0 V because the actuator 110B in the open state.

When the reference signal starts to go low at time t3, the driving control signal also starts to go low and the drain-source voltage Vds starts to increase. At time t3, the load signal starts to go low and the current flowing in the actuator 110A is reduced due to the increase of the drain-source voltage Vds, so the input voltage Va to the failure diagnosis unit 152 starts to drop.

As described above, the input voltage Va2 to the failure diagnosis unit 152 at the time of the occurrence of an open failure in the actuator 110B is higher than the input voltage Va1 to the failure diagnosis unit 152 in the normal state, and the input voltage Vb to the failure diagnosis unit 152 at the time of the occurrence of the open failure (wire breakage) in the actuator 110B becomes 0 V. Therefore, the failure diagnosis unit 152 can decide that there is a failure (an open failure or a short failure) in the actuator 110A or 110B, according to the two input voltages Va and Vb.

Figure 8C:
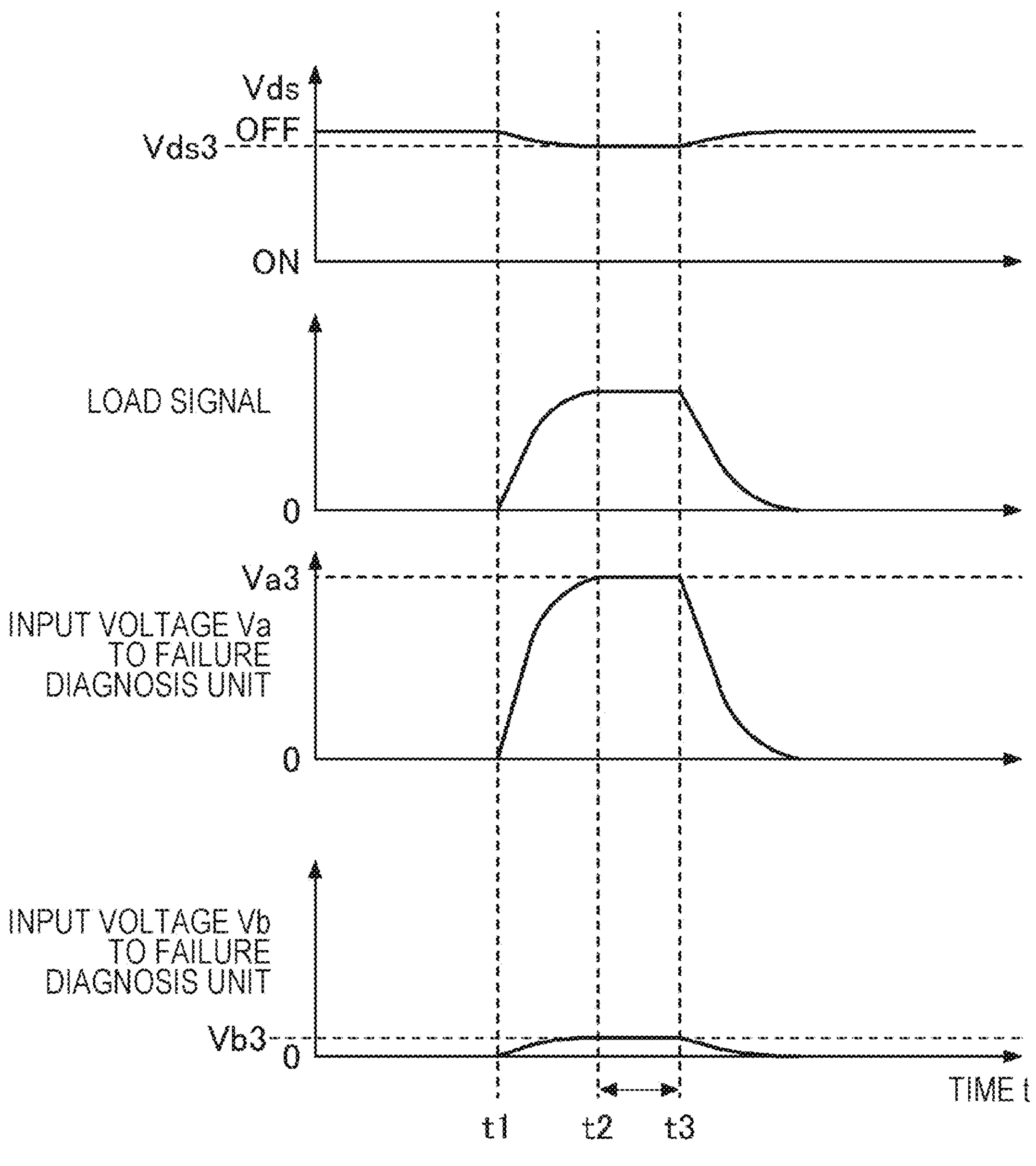
FIG. 8C illustrates voltage waveforms at individual units in the electronic device in embodiment 2 when failure diagnosis was performed while one of the actuators was in the short failure state.

Voltage Waveforms at Individual Units During Failure Diagnosis in the Short Failure State FIG. 8C illustrates voltage waveforms at individual units in the electronic device 200 when failure diagnosis was performed while one of the actuators 110A and 110B was in the short failure state. In FIG. 8C, the horizontal axis represents time and the vertical axis represents voltage value. FIG. 8C illustrates examples of the waveforms of the drain-source voltage Vds of the FET 120, the load signal, and the input voltages to the failure diagnosis unit 152. The reference signal and driving control signal are the same as in FIG. 8A, so they are not illustrated. In the description below, it will be assumed that a short failure has occurred in the actuator 110A as illustrated in FIG. 7C. However, the same is true when a short failure occurs in the actuator 110B.

When the reference signal (see FIG. 8A) goes high at time t1, the driving control signal (see FIG. 8A) also starts to go high and the drain-source voltage Vds starts to drop. At time t1, the load signal starts to go high and the input voltage Va the failure diagnosis unit 152 starts to rise due to the drop of the drain-source voltage Vds.

When the reference signal completely goes high at time t2, the driving control signal also completely goes high and the drain-source voltage Vds drops to Vds3. If the FET 120 is driven when the actuator 110B is in the normal state and a short failure has occurred in the actuator 110A, all currents pass through the actuator 110A as illustrated in FIG. 7C. Thus, the voltage Va across the resistor R8 connected in series with the actuator 110A becomes Va3, which is higher than Va1 in the normal state, and the voltage Vb across the resistor R9 connected in series with the actuator 110B drops to Vb3, which is greatly lower than Vb1 in the normal state.

When the reference signal starts to go low at time t3, the driving control signal also starts to go low and the drain-source voltage Vds starts to increase. At time t3, the load signal starts to go low and the current flowing in the actuator 110A is reduced due to the increase of the drain-source voltage Vds, so the input voltage Va to the failure diagnosis unit 152 starts to drop.

As described above, the input voltage Va3 to the failure diagnosis unit 152 at the time of the occurrence of a short failure in the actuator 110A is higher than the input voltage Va1 to the failure diagnosis unit 152 in the normal state, and the input voltage Vb becomes greatly lower than the input voltage Vb1 in the normal state. Therefore, the failure diagnosis unit 152 can decide that there is a failure (an open failure or a short failure) in the actuator 110A or 110B, according to these input voltages.

Failure Diagnosis by the Failure Diagnosis Unit 152

Figure 9:
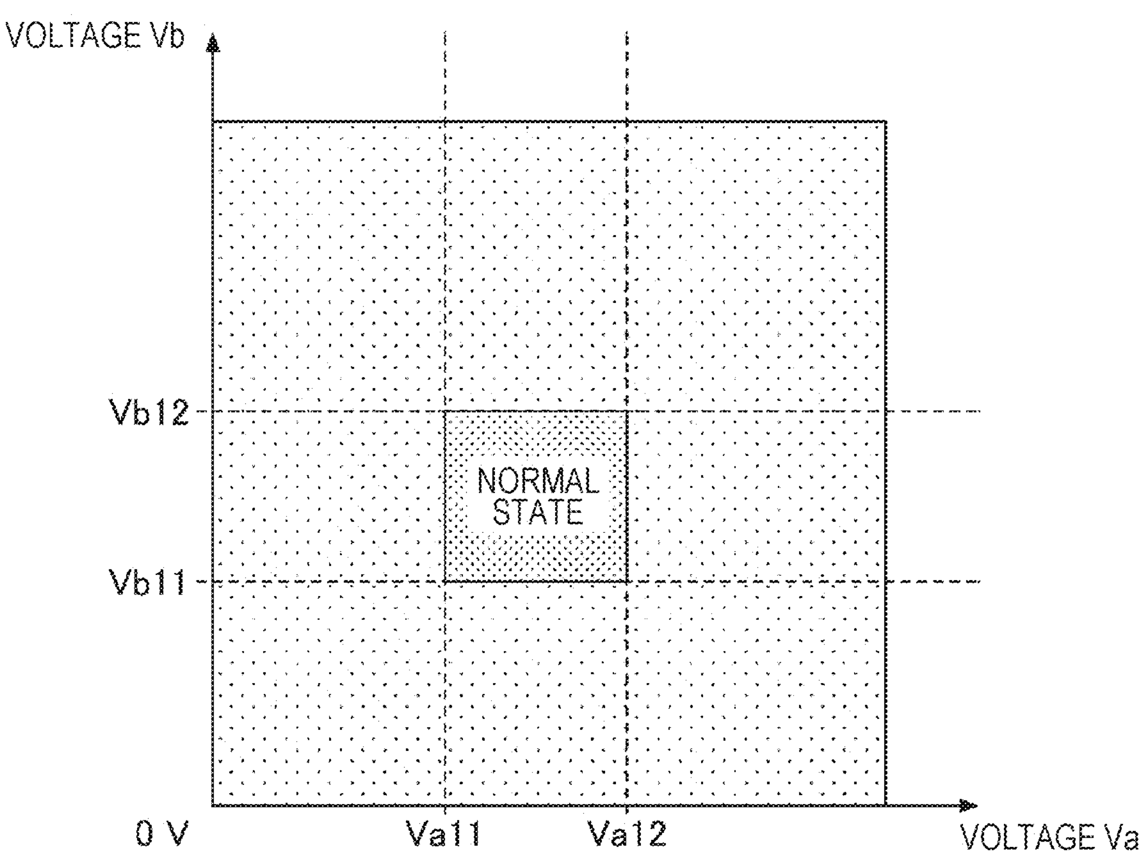
FIG. 9 illustrates voltage data used by the failure diagnosis unit in failure diagnosis in embodiment 2.

FIG. 9 illustrates voltage data used by the failure diagnosis unit 152 in failure diagnosis in embodiment 2. Voltage values included in voltage data illustrated in FIG. 9 are obtained in simulation. The voltage data is stored in the memory 153.

The two input voltages Va and Vb to the failure diagnosis unit 152 are voltages output to the microcontroller 150, the voltages resulting from digital conversion of outputs from the amplifiers 135A and 135B by the ADC 140. If the input voltage Va is higher than or equal to Va11 and lower than or equal to Va12 and the input voltage Vb is higher than or equal to Vb11 and lower than or equal to Vb12, the failure diagnosis unit 152 decides that the actuators 110A and 110B are in the normal state. Va11 is lower than Va12, Vb11 is lower than Vb12, Va11 is equal to Vb11, and Va12 is equal to Vb12. Va11, Va12, Vb11, and Vb12 are positive voltages.

The input voltage Va1, illustrated in FIG. 8A (representing the normal state), to the failure diagnosis unit 152 is higher than or equal to Va11 and lower than or equal to Va12, and the input voltage Vb1 is higher than or equal to Vb11 and lower than or equal to Vb12.

Also, if the input voltage Va is outside the range from Va11 to Va12 or the input voltage Vb is outside the range from Vb11 to Vb12, the failure diagnosis unit 152 may decide that the actuator 110A or 110B is in a failure state. The failure state may be the open failure state of the actuator 110A and/or 110B, the short failure state of the actuator 110A or 110B, or the abnormally high resistance state or abnormally low resistance state of any one of the actuators 110A and actuator 110B.

The failure diagnosis unit 152 does not decide that the failure state of the actuator 110A or 110B is which of the above. In FIG. 9, however, if the voltage Va or Vb is 0 V, this indicates that there is an open failure or short failure; and if the voltages Va and Vb are 0 V, this indicates that there is an open failure in the actuators 110A and 110B.

As described above, the ope-amplifier 130, which drives the FET 120, outputs, to the FET 120, the driving control signal that represents a result of comparison between the load signal resulting from converting a current flowing in the current path to a voltage and the reference signal used as a reference for the operation of the FET 120; and if the failure diagnosis unit 152 detects a voltage outside a normal voltage range, the failure diagnosis unit 152 decides that the actuator 110A or 110B is in the abnormal state.

Thus, the FET 120 is turned on by the driving control signal in a series of steps, so even if the actuator 110A or 110B has a failure, the current flowing in the FET 120 can be suppressed and damage to the FET 120 can be thereby prevented.

Therefore, it is possible to provide the electronic device 200 that can perform failure diagnosis for the actuator 110A or 110B and can suppress damage to the FET 120.

According to the voltages applied to the actuators 110A and 110B, the electronic device 200 in embodiment 2 can detect a failure in the actuator 110A or 110B and can detect an open failure or a short failure in the actuator 110A or 110B, as with the electronic device 100 in embodiment 1. When performing failure diagnosis, the failure diagnosis unit 152 may set the voltage of the reference signal so that predetermined voltages lower than the operating voltages on which the actuators 110A and 110B operate are applied to the plurality of actuators 110A and 110B. Therefore, the failure diagnosis unit 152 can perform failure diagnosis without causing the actuators 110A and 110B to operate.

The electronic device 200 may further include a plurality of resistors R8 and R9 and a plurality of amplifiers 135A and 135B. The resistor R8 is connected in series with the actuator 110A, and the resistor R9 is connected in series with the actuator 110B. The amplifier 135A amplifies a voltage across both terminals of the resistor R8, and the amplifier 135B amplifies a voltage across both terminals of the resistor R9. The resistor R8 may have a first terminal T81 connected to the actuator 110A, as well as a second terminal T82 connected to the FET 120. The resistor R9 may have a first terminal T91 connected to the actuator 110B, as well as a second terminal T92 connected to the FET 120. The non-inverting input terminal of the amplifier 135A may be connected to the first terminal T81. The non-inverting input terminal of the amplifier 135B may be connected to the first terminal T91. The inverting input terminal of the amplifier 135A may be connected to the second terminal T82. The inverting input terminal of the amplifier 135B may be connected to the second terminal T92. The failure diagnosis unit 152 may perform failure diagnosis according to the output voltages from the amplifiers 135A and 135B. Thus, it is possible to provide the electronic device 200 that can perform failure diagnosis according to the currents flowing in the actuators 110A and 110B.

An aspect has been described above in which the failure diagnosis unit 152 decides that an open failure, a short failure, or another abnormal state (abnormally high resistance state or abnormally low resistance state, for example) has occurred in a plurality of actuators 110A and 110B, according to the output voltage from the ADC 140. However, in a case as well in which, for example, the electronic device 200 includes only any one of the actuators 110A and 110B, if an open failure, a short failure, or another abnormal state (abnormally high resistance state or abnormally low resistance state, for example) occurs, the output voltage from the ADC 140 changes. Thus, the electronic device 200 may be structured so as to include only one actuator. In this case, if the electronic device 200 includes the actuator 110A in FIG. 6 and lacks the actuator 110B, for example, constituent elements included in a path from the power supply terminal 101 through the actuator 110B to the drain terminal (D) of the FET 120 and constituent elements included in a path from the actuator 110B to the ADC 140 are unnecessary. It suffices for the failure diagnosis unit 152 to decide that an open failure, a short failure, or another abnormal state (abnormally high resistance state or abnormally low resistance state, for example) has occurred in the one actuator 110A, according to the output voltage from the ADC 140.

This completes the description of the electronic device in an exemplary embodiment of the present invention. However, the present disclosure is not limited to specifically disclosed embodiments, but can be varied and modified in various other ways without departing from the scope of the claims.

This international application claims priority based on Japanese Patent Application No. 2022-003500 filed on Jan. 13, 2022, and the entire contents of the application are incorporated in this international application by reference in it.

What is claimed is:

1. An electronic device comprising:

a plurality of loads;

a switching element provided in a current path connected to the plurality of loads;

a failure diagnosis unit that performs failure diagnosis according to a voltage applied to the plurality of loads; and a driving circuit that drives the switching element, wherein the driving circuit outputs, to the switching element, a driving control signal that represents a result of comparison between a load signal resulting from converting a current flowing in the current path to a voltage and a reference signal used as a reference for an operation of the switching element, the driving control signal is generated only in a failure diagnosis mode in which the reference signal is set as a predetermined diagnostic voltage that is applied to the plurality of loads, and the predetermined diagnostic voltage is lower than an operating voltage of the plurality of loads, and when the failure diagnosis unit detects a voltage outside a normal voltage range, the failure diagnosis unit decides that the plurality of loads are in an abnormal state.

2. The electronic device according to claim 1, wherein the failure diagnosis unit decides whether the plurality of loads are in the abnormal state or a normal state, and the abnormal state is one of an open failure state, a short failure state, or, and another abnormal state of the plurality of loads.

3. The electronic device according to claim 1, wherein an input voltage to the failure diagnosis unit corresponds to:

an open failure state in which a normal voltage of the plurality of loads in a normal state is higher than an open voltage of the plurality of loads when an open failure occurs in the plurality of loads; and an short failure state in which a short voltage of the plurality of loads in the abnormal state is higher than the normal voltage of the plurality of loads when a short failure occurs in the plurality of loads.

4. The electronic device according to claim 1, wherein the failure diagnosis unit performs the failure diagnosis according to the voltage of the current path between the plurality of loads and the switching element.

5. The electronic device according to claim 1, further comprising:

a plurality of resistors, each of which is connected in series with a corresponding load of the plurality of loads; and a plurality of amplifiers, each of which amplifies a voltage across first and second terminals of a corresponding resistor of the plurality of resistors, wherein the first terminal of the corresponding resistor is connected to the corresponding load, and the second terminal of the corresponding resistor is connected to the switching element, a non-inverting input terminal of a corresponding amplifier of the plurality of amplifiers is connected to the first terminal of the corresponding resistor, and an inverting input terminal of the corresponding amplifier is connected to the second terminal of the corresponding resistor, and the failure diagnosis unit performs the failure diagnosis according to an output voltage from each of the plurality of amplifiers.

6. An electronic device comprising:

a load;

a switching element provided in a current path connected to the load;

a failure diagnosis unit that performs failure diagnosis according to a voltage applied to the load; and a driving circuit that drives the switching element, wherein the driving circuit outputs, to the switching element, a driving control signal that represents a result of comparison between a load signal resulting from converting a current flowing in the current path to a voltage and a reference signal used as a reference for an operation of the switching element, the driving control signal is generated only in a failure diagnosis mode in which the reference signal is set as a predetermined diagnostic voltage that is applied to the load, and the predetermined diagnostic voltage is lower than an operating voltage of the load, and when the failure diagnosis unit detects a voltage outside a normal voltage range, the failure diagnosis unit decides that the load is in an abnormal state.

7. The electronic device according to claim 6, wherein the failure diagnosis unit decides whether the load is in the abnormal state or a normal state, and the abnormal state is one of an open failure state, a short failure state, and another abnormal state of the load.

8. The electronic device according to claim 6, wherein an input voltage to the failure diagnosis unit corresponds to:

an open failure state in which a normal voltage of the load in a normal state is higher than an open voltage of the load when an open failure occurs in the load; and an short failure state in which a short voltage of the load in the abnormal state is higher than the normal voltage of the load when a short failure occurs in the load.

9. The electronic device according to claim 6, wherein the failure diagnosis unit performs the failure diagnosis according to the voltage of the current path between the load and the switching element.

10. The electronic device according to claim 6, further comprising:

a resistor connected in series with the load; and an amplifier amplifying a voltage across first and second terminals of the resistor, wherein the first terminal of the resistor is connected to the load, and the second terminal of the resistor is connected to the switching element, a non-inverting input terminal of the amplifier is connected to the first terminal of the resistor, and an inverting input terminal of the amplifier is connected to the second terminal of the resistor, and the failure diagnosis unit performs the failure diagnosis according to an output voltage from the amplifier.

11. The electronic device according to claim 1, further comprising:

a power supply terminal from which power is supplied for the electronic device, wherein each of the plurality loads has first and second ends opposite to each other, and the first end of each of the plurality of loads is electrically connected to the power supply terminal, the second end of each of the plurality of loads is connected to the switching element, and the failure diagnosis unit performs failure diagnosis according to the voltage at a node, and the node is located between the plurality of loads and the switching element in the current path.

* * * * *